United States Patent [19]

Takizawa et al.

[11] Patent Number: 5,483,082

[45] Date of Patent: Jan. 9, 1996

[54] THIN FILM TRANSISTOR MATRIX DEVICE

[75] Inventors: Hideaki Takizawa; Yasuhiro Nasu; Kazuhiro Watanabe; Shiro Hirota; Kazuo Nonaka; Seii Sato; Teiji Majima, all of Kawasaki, Japan

[73] Assignee: Fujitsu Limited, Kawasaki, Japan

[21] Appl. No.: 174,030

[22] Filed: Dec. 28, 1993

[30] Foreign Application Priority Data

Dec. 28, 1992 [JP] Japan .................. 4-348260

[51] Int. Cl.⁶ .................. H01L 27/12; H01L 29/78
[52] U.S. Cl. .................. 257/59; 257/71; 257/72; 257/292; 257/448; 359/59; 359/87; 359/88
[58] Field of Search .................. 257/72, 57, 59, 257/448, 292, 71; 359/59, 87, 88

[56] References Cited

FOREIGN PATENT DOCUMENTS

| | | | |
|---|---|---|---|
| 58-190063 | 11/1983 | Japan . | |
| 61-097864 | 5/1986 | Japan . | |
| 62-073659 | 4/1987 | Japan . | |
| 1-124824 | 5/1989 | Japan . | |
| 2-48639 | 2/1990 | Japan | 359/59 |
| 3-274029 | 12/1991 | Japan | 359/59 |
| 4-265945 | 9/1992 | Japan | 359/59 |

*Primary Examiner*—William Mintel
*Assistant Examiner*—Minhloan Tran
*Attorney, Agent, or Firm*—Staas & Halsey

[57] ABSTRACT

A thin film transistor matrix device comprises a transparent insulating substrate, a thin film transistor unit, a picture element unit, a storage capacitance unit, a gate terminal unit, and a drain terminal unit, the storage capacitance unit including a storage capacitance electrode formed on the transparent insulating substrate and formed of a metal layer of the same material as the gate electrode; a dielectric film formed on the storage capacitance electrode and formed of an insulating film common with the gate insulating film and a non-doped semiconductor layer of the same material as the semiconductor active layer; and a counter electrode formed on the dielectric film and formed of a doped semiconductor layer of the same material as the semiconductor contact layer and a metal layer of the same material as the source electrode and the drain electrode, the counter electrode being connected to the picture element electrode through a contact hole opened in a protecting film common with the passivation film. Thus, the fabrication process of the TFT matrix device can be simplified, and lower costs can be realized. Characteristic changes of the storage capacitance can be prevented, and yields and reliability can be improved.

6 Claims, 28 Drawing Sheets

THIN FILM TRANSISTOR MATRIX DEVICE

BACKGROUND OF THE INVENTION

This invention relates to a TFT (thin film transistor) matrix device and a method for fabricating the same, especially to a TFT-LCD (TFT matrix liquid crystal display) device and a method for fabricating the same.

TFT-LCDs have characteristics of thinness and lightness, low power consumption, etc. and are expected to have in future a large market as a display device which will take place of CRTs. It is an important subject to develop fabrication technique for realizing high achievement and low prices of TFT-LCDs.

The conventional inverse staggered TFT matrix devices will be explained with reference to FIGS. 17, 18A, 18B, 18C, and 18D.

FIG. 17 is a plan view of a TFT matrix device. FIGS. 18A, 18B, 18C, and 18D are respectively a sectional view of a drain terminal unit along the line A—A' in FIG. 17, a sectional view of a TFT unit along the line B—B' therein, a sectional view of a picture element unit and a storage capacitance unit along the line C—C' therein, and a sectional view of a gate terminal unit along the line D—D' therein.

In the TFT unit of the TFT matrix device, a gate electrode 52a of a metal layer of, e.g., Al (aluminum) or Cr (chrome) or others is formed on a transparent insulating substrate 50. An a-Si (amorphous-silicon) active layer 56a is formed on the gate electrode 52a through a gate insulating film 54a. On the a-Si active layer 56a is formed a channel protecting film 58a, and a source electrode 62a and a drain electrode 62b which connect the a-Si active layer 56a respectively through an $n^+$-type a-Si contact layers 60a, 60b. The thus-fabricated TFT is covered by a passivation film 70.

In the picture element unit, a picture element electrode 68a of a transparent conducting film of, e.g., ITO (indium tin oxide) connected to the source electrode 62a is formed and is exposed at a window 72a formed in the passivation film 70.

In the storage capacitance unit, Cs (storage capacitance) electrode 52b of a metal layer of the same material as the gate electrode 52a is formed on the transparent insulating substrate 50. On the Cs electrode 52b is formed a dielectric film 54b of an insulating film 54 which is common with the gate insulating film 54a. The picture element electrode 68a which functions as the counter electrode is formed on the dielectric film 54b. The storage capacitance unit is formed of the Cs electrode 52b and the picture element electrode 68a as the counter electrode which hold the dielectric film 54b therebetween.

In the drain terminal unit, a drain terminal lower electrode 64 is formed of an $n^+$-type a-Si layer 60 and a metal layer 62 respectively common with the $n^+$-type a-Si contact layer 60b and the drain electrode 62b. A drain terminal upper electrode 68b of the same transparent conducting film as the picture element electrode 68a is formed on the drain terminal lower electrode 64. The drain terminal upper electrode 68b covers the drain terminal lower electrode 64 for preventing the oxidation of the metal film 62 of Al, Cr, or others on the surface of the drain terminal lower electrode 64.

Thus, the drain terminal unit comprises the drain terminal lower electrode 64 connected to the drain electrode 62b through a drain bus line 74, and the drain terminal upper electrode 68b formed on the drain terminal lower electrode 64 and the passivation film 70, and the drain terminal upper electrode 68b is exposed at a window 72b formed in the passivation film 70.

In the gate terminal unit, a gate terminal lower electrode 52d is formed of a metal layer common with the gate electrode 52a and a gate bus line 52c. A gate terminal upper electrode 68c of the same transparent conducting film as the picture element electrode 68a is formed on the gate terminal lower electrode 52d through a contact hole 66 formed in an insulating film 54 common with a gate insulating film 54a formed on the gate terminal lower electrode 52d. The gate terminal upper electrode 68c covers the gate terminal lower electrode 52d for preventing the oxidation of the gate terminal lower electrode 52d of the metal layer of Al, Cr or others.

Thus, the gate terminal unit comprises the gate terminal lower electrode 52d connected to the gate electrode 52a through the gate bus line 52c, and the gate terminal upper electrode 68a formed on the gate terminal lower electrode 52d and the insulating film 54. The gate terminal upper electrode 68c is exposed at a window 72 opened in the passivation film 70.

Next, the method for fabricating the TFT matrix device of FIGS. 17, 18A, 18B, 18C, and 18D will be explained with reference to FIGS. 19A to 28D which are sectional views of the TFT matrix device in its fabrication steps. FIGS. 19A, 20A, . . . , 28A represent the drain terminal unit, FIGS. 19B, 20B, . . . , 28B represent the TFT unit, FIGS. 19C, 20C, . . . , 28C represent the picture element unit and the storage capacitance unit, and FIGS. 19D, 20D, . . . , 28D represent the gate terminal unit respectively along the line A—A' section, the B—B' section, C—C' section and the D—D' section in FIG. 17.

The metal film of, e.g., Al, Cr or others is formed on the transparent insulating substrate 50 and then is provided with a required pattern to form the gate electrode 52a, the Cs electrode 52b, the gate bus line 52c connected to the gate electrode 52a, and the gate terminal lower electrode 52d connected to the gate bus line 52c (FIGS. 19A to 19D).

Then, the insulating film 54 is formed on the entire surface. The insulating film 54 on the gate electrode 52a and the insulating film 54 on the Cs electrode 52b are here especially called a gate insulating film 54a and a dielectric film 54b respectively. Subsequently, a non-doped i-type a-Si film 56 and the protecting film 58 are formed on the insulating film 54 in the stated order (FIGS. 20A to 20D).

Then, the protecting film 58 except a part on the TFT channel unit is etched off. That is, the part of the protecting film 58 only above the gate electrode 52a of the TFT unit is left to form the channel protecting film 58a (FIGS. 21A to 21D).

Then, after the $n^+$-type a-Si layer 60 is formed, the metal film 62 of, e.g., Al, Cr or others is formed (FIGS. 22A to 22D).

Then, the metal film 62, the $n^+$-type a-Si layer 60, the i-type a-Si layer 56 are selectively etched to form the a-Si active layer 56a of the i-type a-Si layer 56 on the gate insulating film 54a of the TFT unit, and to form the source electrode 62a and the drain electrode 62b of the metal layer 62 connected to the a-Si active layer 56a through the $n^+$-type a-Si layers 60a, 60b of the $n^+$-type a-Si layer 60 on both sides of the channel protecting film 58a. Thus, the TFT is completed.

At the same time, in the drain terminal unit, the drain terminal lower electrode 64 of the $n^+$-type a-Si layer 60 and the metal layer 62 connected to the drain electrode 62b through the drain bus line is formed (FIGS. 23A to 23D).

Then, a resist is applied, and a resist pattern with an opening on the gate terminal lower electrode 52d is formed by lithography. With the resist pattern as a mask, the insulating film 54 is etched to open a contact hole 66 (FIGS. 24A to 24D).

Then, the transparent conducting film 68 of ITO or others is formed (FIGS. 25A to 25D).

Then, a required patterning is provided on the transparent conducting film 68 to form the picture element electrode 68a connected to the source electrode 62, and at the same time the drain terminal upper electrode 68b connected to the drain terminal lower electrode 64 is formed, and the gate terminal upper electrode 68c connected to the gate terminal lower electrode 52d through the contact hole 66 is formed. At this time the picture electrode 68a connected to the source electrode 62a covers the dielectric film 54b on the Cs electrode 52b.

Thus, the storage capacitance unit comprising the Cs electrode 52b, the picture element electrode 68a functioning as the counter electrode to the Cs electrode 52b, and the dielectric film 54b held between these electrodes is completed (FIGS. 26A to 26D).

Then, the passivation film 70 is formed on the entire surface to cover the completed TFT (FIGS. 27A to 27D).

Then, a resist is applied, and then a resist pattern having openings on the picture electrode 68a, the drain terminal upper electrode 68b, and the gate terminal upper electrode 68c is formed by photolithography. With the resist pattern as a mask, the passivation film 70 is etched to open the windows 72a, 72b, 72c to expose the picture element electrode 68a, the drain terminal upper electrode 68b and the gate terminal upper electrode 68c.

Thus, the picture element unit comprising the picture element electrode 68a connected to the source electrode 62a of the TFT, the drain terminal unit comprising the drain terminal upper electrode 68b and the drain terminal lower electrode 64 connected to the drain electrode 62b of the TFT through the drain bus line, and the gate terminal unit comprising the gate terminal upper electrode 68c and the gate terminal lower electrode 52d connected to the gate electrode 52d of the TFT through the gate bus line 52c, are respectively completed (FIGS. 28A to 28D).

In the method for fabricating the above-described conventional TFT matrix device, for forming the gate terminal unit, the gate terminal lower electrode 52d is formed on the transparent insulating substrate 50 (FIGS. 19A to 19D), the insulating film 54 is formed on the gate terminal lower electrode 52d (FIGS. 20A to 20D), the insulating film 54 is etched to open the contact hole 66 (FIGS. 24A to 24D), the gate terminal upper electrode 68c connected to the terminal lower electrode 52d through the contact hole 66 is formed (FIGS. 26A to 26D), the passivation film 70 is formed on the gate terminal upper electrode 68c (FIGS. 27A to 27D), the passivation film 70 is etched to open the opening 72c to expose the upper surface of the gate terminal upper electrode 68c (FIGS. 27A to 27D).

That is, two steps of opening windows: as shown in FIGS. 24A to 24D, selectively etching the insulating film 54 on the gate terminal lower electrode 52d to open the contact hole 66, and as shown in FIGS. 28A to 28D selectively etching the passivation film 70 on the gate terminal upper electrode 68c to open the window 72c, whereby the gate terminal is finally exposed, are necessary.

Each of the two window opening steps includes the lithography step for forming a resist pattern, the etching step, and the resist removing step. It is preferable to realize inexpensive TFT-LCDs that a number of window opening steps is decreased as much as possible to simplify the fabrication process.

In the selectively etching step, as shown in FIGS. 23A to 23D, the metal film 62, the $n^+$-type a-Si layer 60, the i-type a-Si active layer 56a are selectively etched to form the a-Si active layer 56a on the gate insulating film 54a of the TFT unit, and to form the source electrode 62a and the drain electrode 62b connected to the a-Si active layer 56a respectively through the $n^+$-type a-Si contact layers 60a, 60b, the dielectric film 54b on the Cs electrode 52b is exposed directly to an etchant, and a thickness of the dielectric film 54b changes, and accordingly a storage capacitance changes adversely.

At this time, pin holes or others in a part of the dielectric film 54b cause a risk that etchant may intrude into the pin holes or others, with a result that defective insulation takes place in the dielectric film 54b, causing current leakage and short circuits between the Cs electrode 52b and the picture element electrode 68a as its counter electrode which result in defective displays.

SUMMARY OF THE INVENTION

An object of this invention is to provide a TFT matrix device and a method for fabricating the same which can simplify the fabrication steps and realize low prices, and which can prevent characteristic changes and realize high achievement.

The above-described objection is achieved by a thin film transistor matrix device comprising:
a transparent insulating substrate;
a thin film transistor unit including a gate electrode formed on the transparent insulating substrate; a semiconductor active layer formed on the gate electrode through a gate insulating film; a source electrode and a drain electrode formed opposed to each other on the semiconductor active layer respectively through a semiconductor contact layer; and a passivation film covering the source electrode and the drain electrode;
a picture element unit including a picture element electrode formed in connection with the source electrode of the thin film transistor unit; and
a storage capacitance unit connected to the picture element electrode of the picture element unit,
the storage capacitance unit including a storage capacitance electrode formed on the transparent insulating substrate and formed of a metal layer of the same material as the gate electrode; a dielectric film formed on the storage capacitance electrode and formed of an insulating film common with the gate insulating film and a non-doped semiconductor layer of the same material as the semiconductor active layer; and a counter electrode formed on the dielectric film and formed of a doped semiconductor layer of the same material as the semiconductor contact layer and a metal layer of the same material as the source electrode and the drain electrode, the counter electrode being connected to the picture element electrode.

In the above-described thin film transistor matrix device, the counter electrode is connected to the picture element electrode through a contact hole opened in a protecting film common with the passivation film.

The above-described objection is achieved by a thin film transistor matrix device comprising:

a transparent insulating substrate;

a thin film transistor unit including a gate electrode formed on the transparent insulating substrate; a semiconductor active layer formed on the gate electrode through a gate insulating film; a source electrode and a drain electrode formed opposed to each other on the semiconductor active layer through a semiconductor contact layer; and a passivation film covering the source electrode and the drain electrode;

a picture element unit including a picture element electrode formed in connection with the source electrode of the thin film transistor unit; and a storage capacitance unit connected to the picture element electrode of the picture element unit, the storage capacitance unit including a storage capacitance electrode formed on the transparent insulating substrate and formed of a metal layer of the same material as the gate electrode; a dielectric film formed on the storage capacitance electrode and formed of an insulating film common with the gate insulating film and a protecting film common with the passivation film, the picture element electrode formed on the dielectric film being a counter electrode.

The above-described objection is achieved by a thin film transistor matrix device comprising:

a transparent insulating substrate;

a thin film transistor unit including a gate electrode formed on the transparent insulating substrate; a semiconductor active layer formed on the gate electrode through a gate insulating film; a source electrode and a drain electrode formed opposed to each other on the semiconductor active layer through a semiconductor contact layer; and a passivation film covering the source electrode and the drain electrode;

a picture element unit including a picture element electrode formed in connection with the source electrode of the thin film transistor unit;

a storage capacitance unit connected to the picture element electrode of the picture element unit;

a gate terminal unit connected to the gate electrode of the thin film transistor unit through a gate bus line; and a drain terminal unit connected to the drain electrode of the thin film transistor unit through a drain bus line, the gate terminal unit including a gate terminal lower electrode formed on the transparent insulating substrate and formed of a metal layer common with the gate electrode; and a gate terminal upper electrode formed on the gate terminal lower electrode through a contact hole opened in an insulating film common with the gate insulating film and a protecting film common with the passivation film and formed of a transparent conducting film of the same material as the picture element electrode.

In the above-described thin film transistor matrix device, the semiconductor active layer is an amorphous silicon active layer.

The above-described objection is achieved by a method for fabricating a thin film transistor matrix device comprising the steps of:

forming a first metal layer on a transparent insulating substrate, and patterning the first metal layer in a required configuration to form a gate electrode, a storage capacitance electrode, a gate bus line connected to the gate electrode, and a gate terminal lower electrode connected to the gate bus line;

forming an insulating film and a non-doped semiconductor layer on the entire surface in the stated order to form a gate insulating film of the insulating film on the gate electrode and to form a dielectric film of the insulating film and the non-doped semiconductor layer on the storage capacitance electrode;

forming a doped semiconductor layer and a second metal layer on the entire surface in the stated order, and next patterning the second metal layer, the doped semiconductor layer and the non-doped semiconductor layer in a required configuration to form a semiconductor active layer of the non-doped semiconductor layer on the gate insulating film, to form a source electrode and a drain electrode of the second metal layer opposed to each other on the semiconductor active layer respectively through a semiconductor contact layer of the doped semiconductor layer, to form a counter electrode of the doped semiconductor layer and the second metal layer on the dielectric film, and to form a drain terminal lower electrode of the doped semiconductor layer and the second metal layer in connection with the drain electrode;

forming a passivation film on the entire surface, and next opening a first to a fourth contact holes in the passivation film on the source electrode, on the counter electrode and on the drain terminal lower electrode, and in the passivation film and the insulating film on the gate terminal lower electrode; and forming a transparent conducting film on the entire surface, and next patterning the transparent conducting film in a required configuration to form a picture element electrode connecting to the source electrode and the counter electrode respectively through the first and the second contact holes, to form a drain terminal upper electrode connecting to the drain terminal lower electrode through the third contact hole, and to form a gate terminal upper electrode connecting to the gate terminal lower electrode through the fourth contact hole.

The above-described objection is achieved by a method for fabricating a thin film transistor matrix device comprising the steps of:

forming a first metal layer on a transparent insulating substrate, and next patterning the first metal layer in a required configuration to form a gate electrode, a storage capacitance electrode, a gate bus line connected to the gate electrode, and a gate terminal lower electrode connected to the gate bus line;

forming an insulating film and a non-doped semiconductor layer on the entire surface in the stated order to form a gate insulating film of the insulating film on the gate electrode;

forming a doped semiconductor layer and a second metal layer on the entire surface in the stated order, and next patterning the second metal layer, the doped semiconductor layer and the non-doped semiconductor layer in a required configuration to form a semiconductor active layer of the non-doped semiconductor layer on the gate insulating film to form a source electrode and a drain electrode of the second metal layer opposed to each other on the semiconductor active layer respectively through a semiconductor contact layer of the doped semiconductor layer, and to form a drain terminal lower electrode of the doped semiconductor layer and the second metal layer;

forming a passivation film on the entire surface to form a dielectric film of the insulating film and the passivation film on the storage capacitance electrode, and next forming a first to a third contact holes in the passivation film on the source electrode and on the drain terminal lower electrode, and in the passivation film and the insulating film on the gate terminal lower electrode; and forming a transparent conducting film on the entire surface, then patterning the transparent conducting film in a required configuration to form a picture element electrode connecting to the source electrode through the first contact hole and functioning as a counter electrode through the dielectric film on the storage capacitance electrode, to form a drain terminal upper electrode connecting to the drain terminal lower electrode through the second contact hole, and to form a gate terminal upper electrode connecting to the gate terminal lower electrode through the third contact hole.

In the above-described method for fabricating a thin film transistor matrix device, the non-doped semiconductor layer is a non-doped amorphous silicon layer; the doped semiconductor layer is a doped amorphous silicon layer.

According to this invention, in forming the gate terminal unit, an insulating film common with a gate insulating film and a protecting film common with a passivation film are formed on a gate terminal lower electrode of a metal layer common with a gate electrode, a contact hole is formed in the insulating film and the protecting film by a single hole forming step, and a gate terminal upper electrode of a transparent conducting film of the same material as a picture element electrode is formed on the gate terminal lower electrode exposed in the contact hole. That is, in comparison with the conventional fabrication method, the sequence of the step of forming the protecting film common with the passivation film and the step of forming the transparent conducting film on the gate terminal upper electrode is reversed.

As a result, the two separate steps of opening a contact hole in the insulating film on the gate terminal lower electrode, and of opening a contact hole in the protecting film of the gate terminal upper electrode as in the conventional fabrication method, can be conducted by a single step of opening a contact hole in the laid insulating film and protecting film. The gate terminal unit comprising the gate terminal lower electrode and the gate terminal upper electrode which are connected to each other through the contact hole can be formed. Accordingly, the fabrication process of the TFT matrix device can be simplified.

In forming the storage capacitance unit, a non-doped semiconductor layer of the same material as a semiconductor active layer is formed on the insulating film common with the gate insulating film on the storage capacitance electrode, then the non-doped semiconductor layer and the insulating film are used as a dielectric film of a storage capacitance, and a counter electrode of a doped semiconductor layer of the same material as a semiconductor contact layer and a metal layer of the same material as a source electrode and a drain electrode is formed on the dielectric film. The counter electrode is connected to the picture element electrode through a contact hole formed in the protecting film on the counter electrode.

Accordingly, the non-doped semiconductor layer on the insulating film is not removed but always covers the insulating film. The insulating film is not exposed directly to etchant, so that no changes of a storage capacitance is caused by changes of a thickness of the dielectric film. Even if there are pin holes, etc. in a part of the insulating film, the non-doped semiconductor layer on the insulating film prevents defective insulation of the dielectric film. Accordingly, there is no possibility that defective displays due to current leakage and short circuits may take place.

Furthermore, the non-doped semiconductor layer which is a part of the dielectric film, and the counter electrode thereon are formed of the same material as the semiconductor active layer, the semiconductor contact layer and the source and the drain electrodes of the TFT concurrently therewith. In addition, a contact hole through which the counter electrode and the picture element electrode are connected to each other is formed concurrently with opening a window in the gate terminal unit. Accordingly, no additional steps are necessary.

Thus, without adding steps, characteristic changes of the storage capacitance can be prevented, and higher yields and higher reliability can be realized.

Thus, this invention comprises the step of forming a gate electrode, a storage capacitance electrode and a gate terminal lower electrode of a first metal layer on a transparent insulating substrate, the step of forming a gate insulating film on the gate electrode, the step of forming a source electrode and a drain electrode connected to a semiconductor active layer on the gate insulating film respectively through semiconductor contact layers, concurrently therewith forming a counter electrode of a doped semiconductor layer of the same material as the semiconductor contact layer and a second metal layer of the same material as the source electrode and the drain electrode above the storage capacitance electrode through an insulating film common with the gate insulating film and a dielectric film of the same material as the semiconductor active layer, the step of forming contact holes in a passivation film or in the passivation film and a insulating film on the source electrode, the counter electrode and the gate terminal lower electrode, and the step of forming a picture element electrode of a transparent conducting film connected to the source electrode and the counter electrode through the respective contact holes, concurrently therewith forming a gate terminal upper electrode connected to the gate terminal lower electrode, whereby the contact holes are formed in the laid insulating film and protecting film on the gate terminal lower electrode by a single contact hole opening step, and the gate terminal unit comprising the gate terminal lower electrode and the gate terminal upper electrode connected to each other through the opened contact hole can be formed. Accordingly, the fabrication process of the TFT matrix device can be simplified.

The insulating film on the storage capacitance electrode is always covered with the non-doped semiconductor layer, so that the insulating film is not exposed directly to etchant. Accordingly, no changes of a thickness of the dielectric film comprising the insulating film and the non-doped semiconductor layer, and no defective insulation take place. Defective displays due to characteristic changes of the storage capacitance, current leakage, etc. can be prevented.

Thus, the fabrication process of the TFT matrix device can be simplified, and lower costs can be realized. Characteristic changes of the storage capacitance can be prevented, and yields and reliability can be improved.

DETAILED DESCRIPTION OF THE INVENTION

This invention will be specifically explained by means of embodiments thereof.

Figure 1:
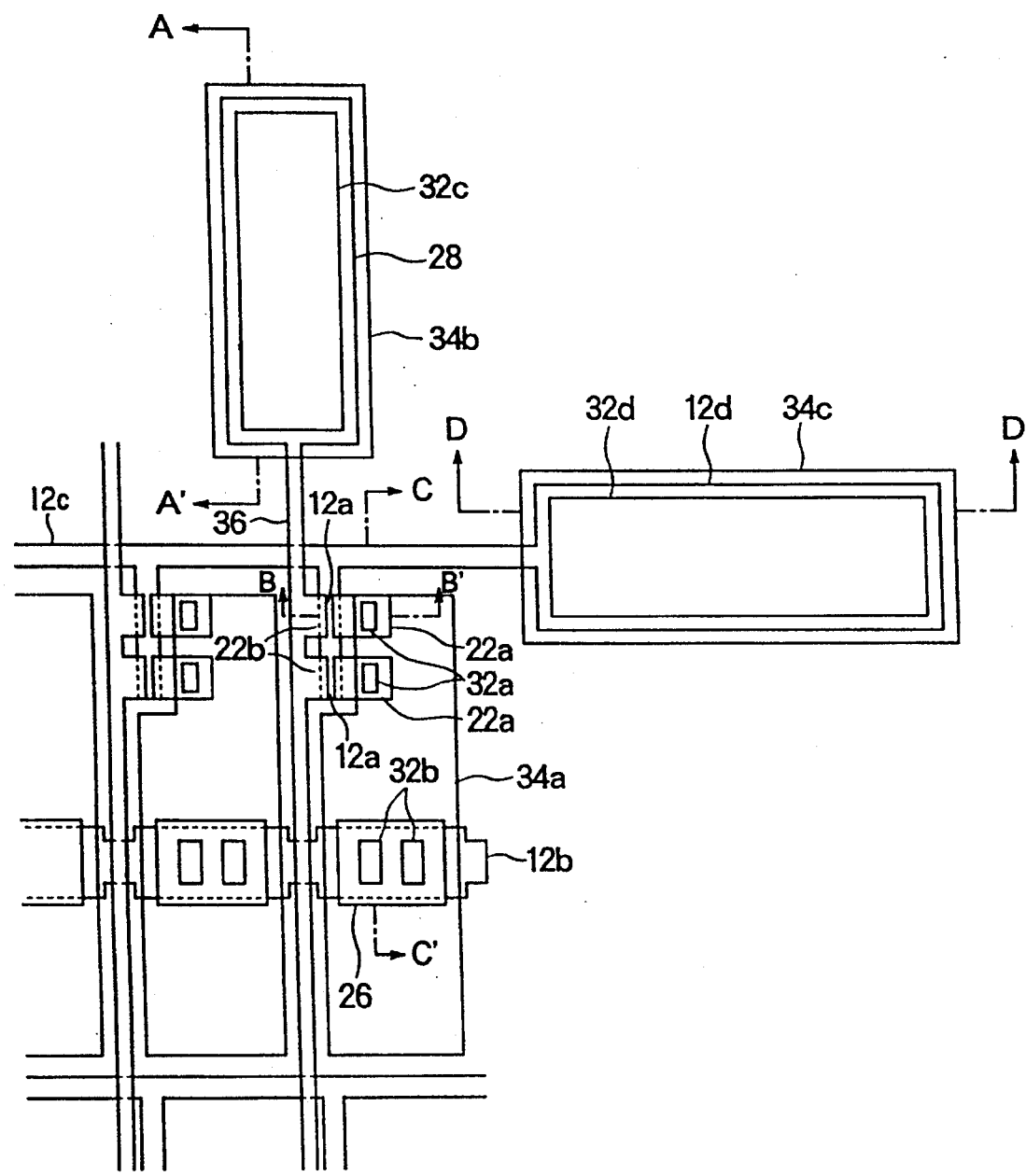
FIG. 1 is a plan view of the inverse staggered TFT matrix device according to a first embodiment of this invention.
Figure 2A:
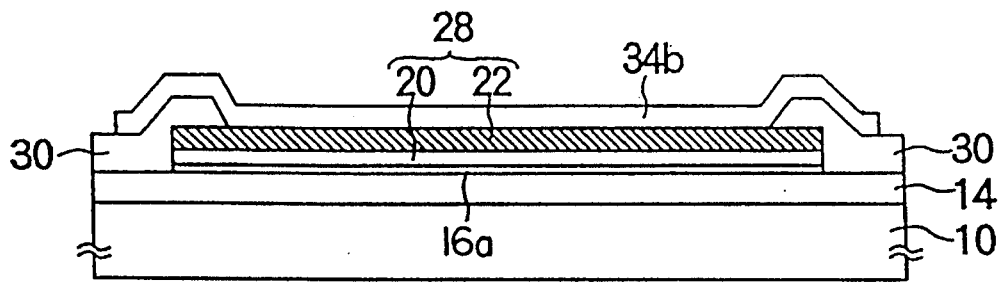
FIG. 2A is a sectional view of the drain terminal unit of the inverse staggered TFT matrix device of FIG. 1.
Figure 2B:
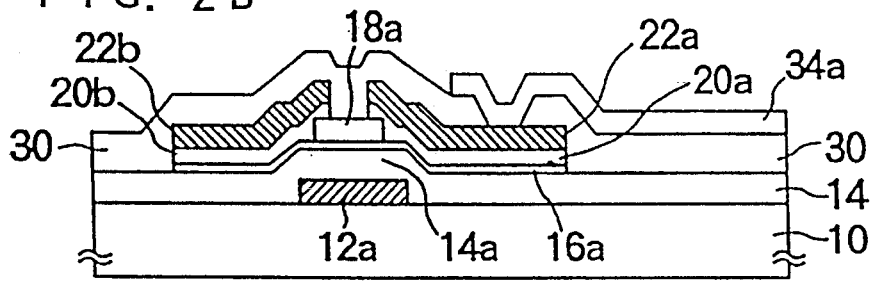
FIG. 2B is a sectional view of the TFT unit of the inverse staggered TFT matrix device of FIG. 1.
Figure 2C:
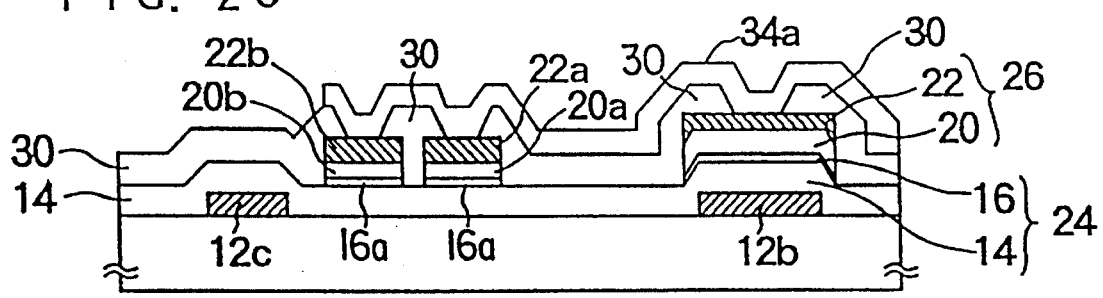
FIG. 2C is a sectional view of the picture element unit and the storage capacitance unit of the inverse staggered TFT matrix device of FIG. 1.
Figure 2D:
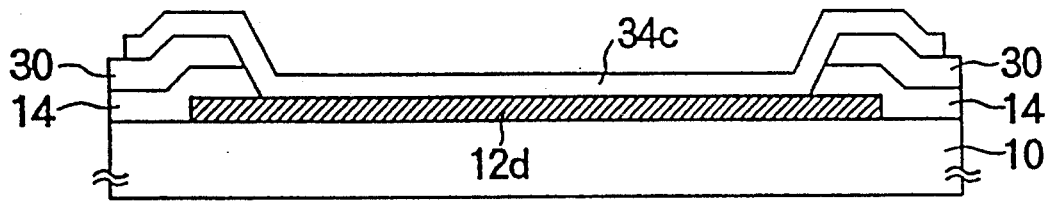
FIG. 2D is a sectional view of the gate terminal unit of the inverse staggered TFT matrix device of FIG. 1.

FIG. 1 is a plan view of the inverse staggered TFT matrix device according to a first embodiment of this invention. FIGS. 2A, 2B, 2C, and 2D are sectional views of the drain terminal unit along the line A—A' in FIG. 1, the TFT unit along the line B—B' therein, the picture element unit and the storage capacitance unit along the line C—C' therein, and the gate terminal unit along the line D—D' therein, respectively.

In the TFT unit of the TFT matrix device, a gate electrode 12a of a metal layer of, e.g., Al, Cr or others is formed on a transparent insulating substrate 10 of glass or others. An a-Si active layer 16a is formed on the gate electrode 12a through a gate insulating film 14a of a SiN film or two layer films of an SiN film and a $SiO_2$ film.

A channel protecting film 18a is formed on the a-Si active layer 16a. A source electrode 22a and a drain electrode 22b are formed on both sides of the channel protecting film 18a opposed to each other and are connected to the a-Si active layer 16a respectively through $n^+$-type a-Si contact layers 20a, 20b. A passivation film 30 covers the thus-fabricated TFT.

In the picture element unit, there is formed a picture element electrode 34a of a transparent conducting film of ITO or others connected to the source electrode 22a through a contact hole 32a opened in the passivation film 30.

In the storage capacitance unit, there is formed a Cs (storage capacitance) electrode 12b of a metal layer of the same material as the gate electrode 12a on the transparent substrate 10. A dielectric film 24 comprising an insulating film 14 common with the gate insulating film 14a, and a non-doped i-type a-Si layer 16 of the same material as the a-Si active layer 16a is formed on the Cs electrode 12b. On the dielectric film 24, there is formed a counter electrode 26 comprising an $n^+$-type a-Si layer 20 of the same material as the $n^+$-type a-Si contact layers 20a, 20b, and a metal layer 22 of the same material as the source and the drain electrodes 22a, 22b.

The counter electrode 26 is connected to the picture element electrode 34a through a contact hole 32b opened in the passivation film 30. Thus, the storage capacitance unit comprising the counter electrode 26 and the Cs electrode 12b with the dielectric film 24 held therebetween is formed in connection with the picture element electrode 34a.

In the drain terminal unit, a drain terminal lower electrode 28 comprises the $n^+$-type a-Si layer 20 common with the $n^+$-type a-Si contact layer 20b and a metal layer 22 common with the drain electrode 22b. The drain terminal lower electrode 28 is connected to a plurality of drain electrodes 22b of the TFT matrix device through drain bus lines 36.

A drain terminal upper electrode 34b is formed of an oxide conducting film of the same material as the picture element 34a on the drain terminal lower electrode 28 through a contact hole 32c opened in the passivation film 30 covering the TFT for the prevention of the oxidation of the drain terminal lower electrode 28.

Thus, the drain terminal unit comprises the drain terminal lower electrode 28 formed on the non-doped i-type a-Si layer 16 of the same material as the a-Si active layer 16a above the transparent insulating substrate 10, and the drain terminal upper electrode 34b formed on the drain terminal lower electrode 28 and the passivation film 30, and is connected to an outside control circuit.

In the gate terminal unit, a gate terminal lower electrode 12d is formed of a metal layer common with a gate electrode 12a and a gate bus line 12c. The gate terminal lower electrode 12d is connected to a plurality of gate electrodes 12a of the TFT matrix device through gate bus lines 12c.

A gate terminal upper electrode 34c is formed of an oxide conduction film of the same material as the picture element electrode 34a on the gate terminal lower electrode 12d through the contact hole 32d opened in the passivation film 30 and the insulating film 14 common with the gate insulating film 14a for the prevention of the oxidation of the gate terminal lower electrode 12d.

Thus, the gate terminal unit comprises the gate terminal lower electrode 12d formed on the transparent insulation substrate 10, and the gate terminal upper electrode 34c formed on the gate terminal lower electrode 12d, and on the insulating film and the passivation film 30 and is connected to the outside control circuit.

Figure 3A:
FIG. 3A is a sectional view (Part 1) of the inverse staggered TFT matrix device of FIGS. 1 and 2A in steps of the method for fabricating the same.
Figure 3B:
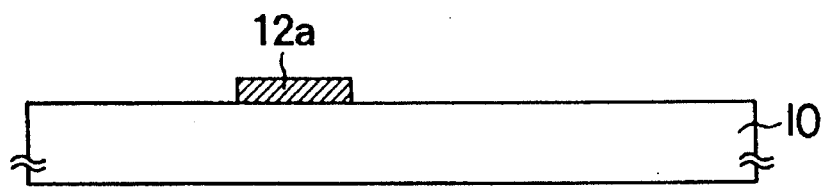
FIG. 3B is a sectional view (Part 1) of the inverse staggered TFT matrix device of FIGS. 1 and 2B in steps of the method for fabricating the same.
Figure 3C:
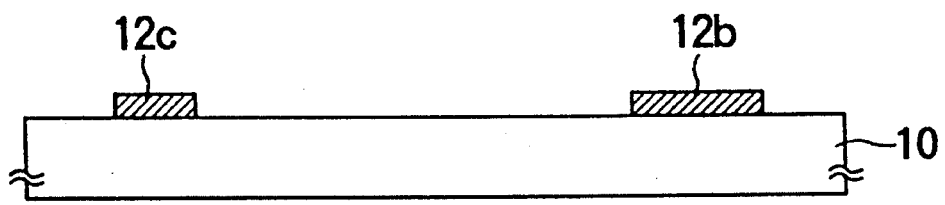
FIG. 3C is a sectional view (Part 1) of the inverse staggered TFT matrix device of FIGS. 1 and 2C in steps of the method for fabricating the same.
Figure 3D:
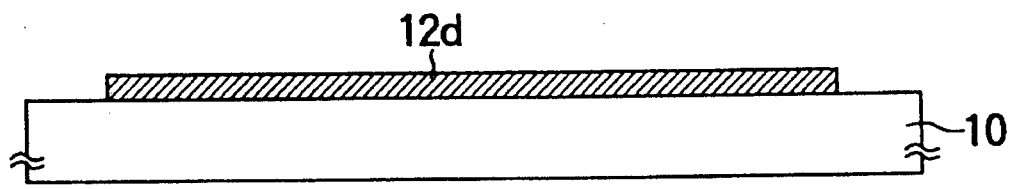
FIG. 3D is a sectional view (Part 1) of the inverse staggered TFT matrix device of FIGS. 1 and 2D in steps of the method for fabricating the same.
Figure 4A:
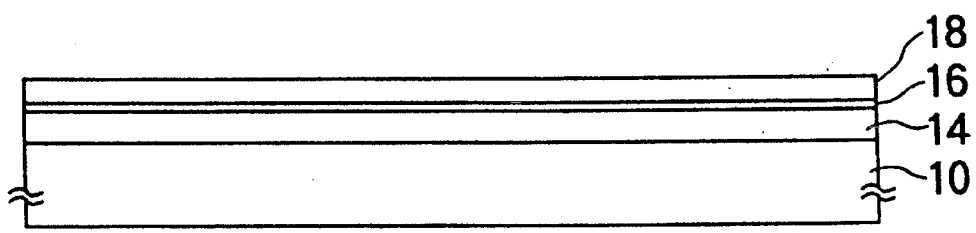
FIG. 4A is a sectional view (Part 2) of the inverse staggered TFT matrix device of FIGS. 1 and 2A in steps of the method for fabricating the same.
Figure 4B:
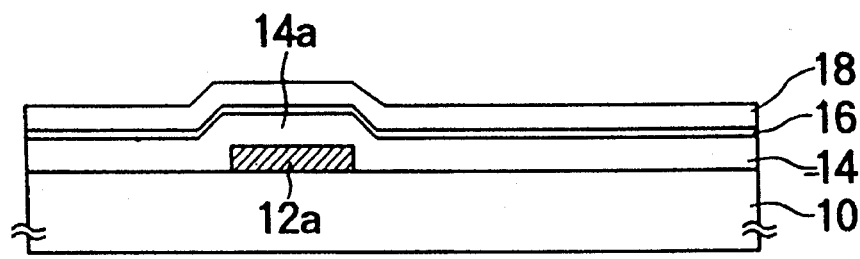
FIG. 4B is a sectional view (Part 2) of the inverse staggered TFT matrix device of FIGS. 1 and 2B in steps of the method for fabricating the same.
Figure 4C:
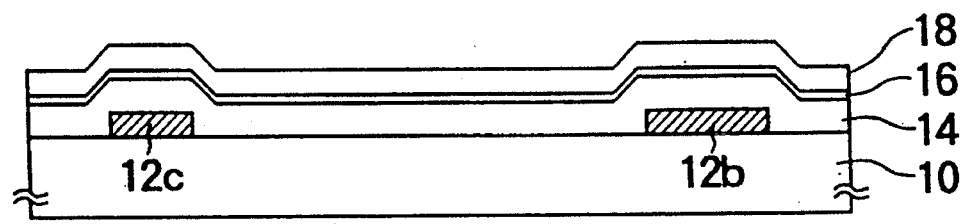
FIG. 4C is a sectional view (Part 2) of the inverse staggered TFT matrix device of FIGS. 1 and 2C in steps of the method for fabricating the same.
Figure 4D:
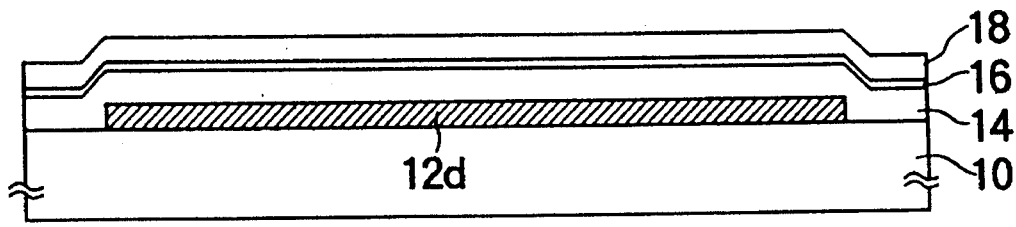
FIG. 4D is a sectional view (Part 2) of the inverse staggered TFT matrix device of FIGS. 1 and 2D in steps of the method for fabricating the same.
Figure 5A:
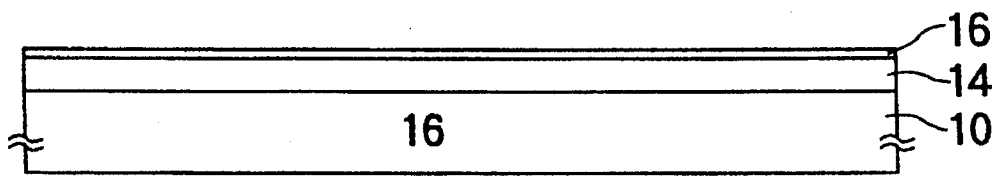
FIG. 5A is a sectional view (Part 3) of the inverse staggered TFT matrix device of FIGS. 1 and 2A in steps of the method for fabricating the same.
Figure 5B:
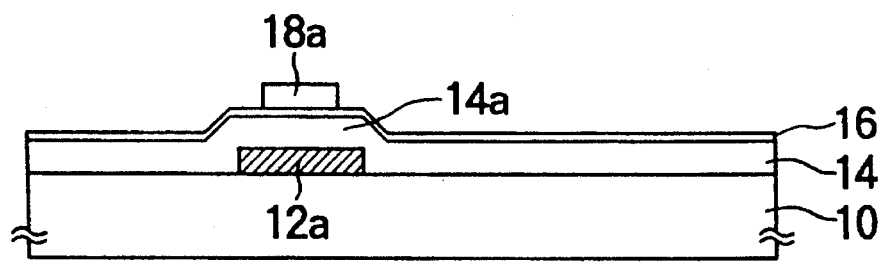
FIG. 5B is a sectional view (Part 3) of the inverse staggered TFT matrix device of FIGS. 1 and 2B in steps of the method for fabricating the same.
Figure 5C:
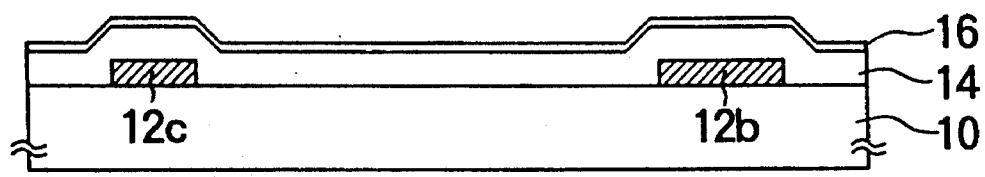
FIG. 5C is a sectional view (Part 3) of the inverse staggered TFT matrix device of FIGS. 1 and 2C in steps of the method for fabricating the same.
Figure 5D:
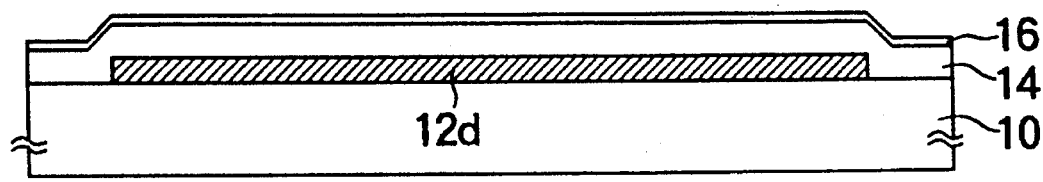
FIG. 5D is a sectional view (Part 3) of the inverse staggered TFT matrix device of FIGS. 1 and 2D in steps of the method for fabricating the same.
Figure 6A:
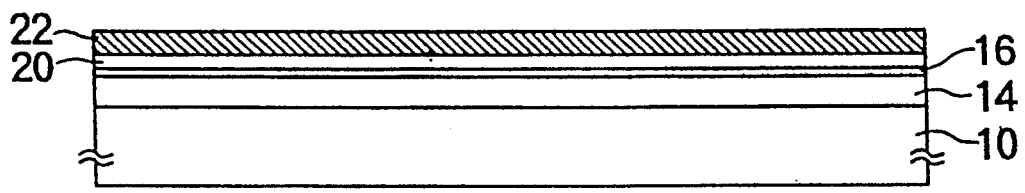
FIG. 6A is a sectional view (Part 4) of the inverse staggered TFT matrix device of FIGS. 1 and 2A in steps of the method for fabricating the same.
Figure 6B:
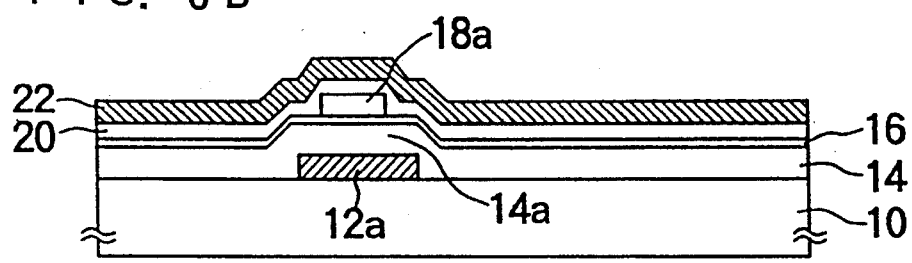
FIG. 6B is a sectional view (Part 4) of the inverse staggered TFT matrix device of FIGS. 1 and 2B in steps of the method for fabricating the same.
Figure 6C:
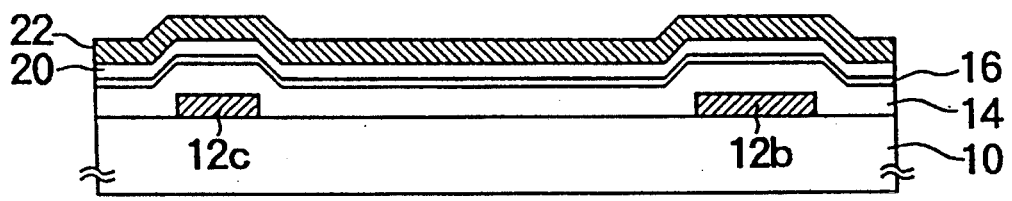
FIG. 6C is a sectional view (Part 4) of the inverse staggered TFT matrix device of FIGS. 1 and 2C in steps of the method for fabricating the same.
Figure 6D:
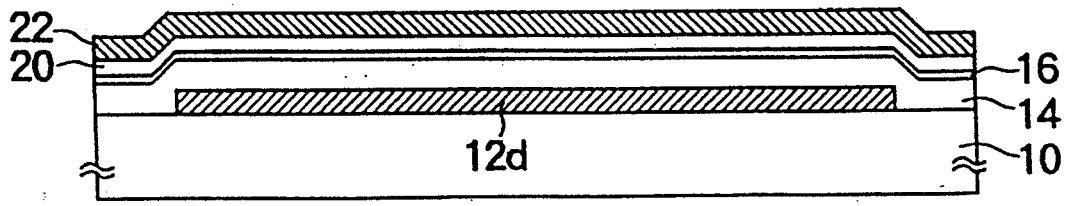
FIG. 6D is a sectional view (Part 4) of the inverse staggered TFT matrix device of FIGS. 1 and 2D in steps of the method for fabricating the same.
Figure 7A:
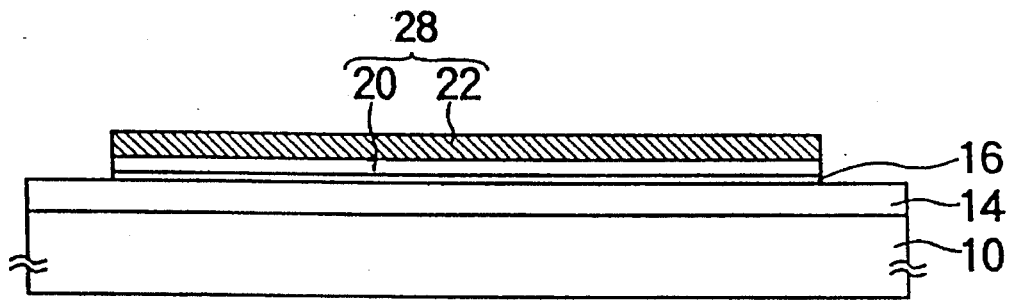
FIG. 7A is a sectional view (Part 5) of the inverse staggered TFT matrix device of FIGS. 1 and 2A in steps of the method for fabricating the same.
Figure 7B:
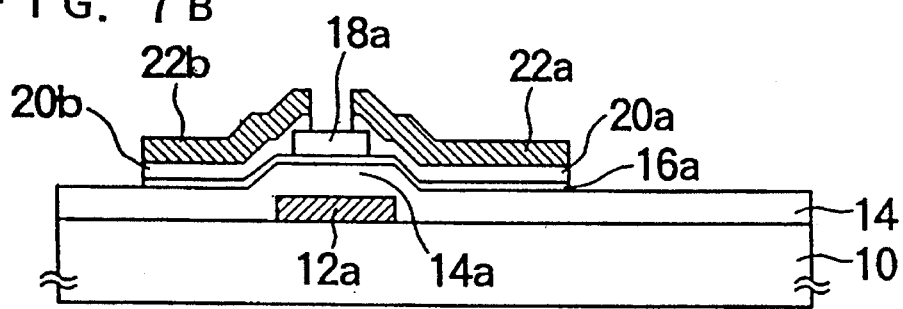
FIG. 7B is a sectional view (Part 5) of the inverse staggered TFT matrix device of FIGS. 1 and 2B in steps of the method for fabricating the same.
Figure 7C:
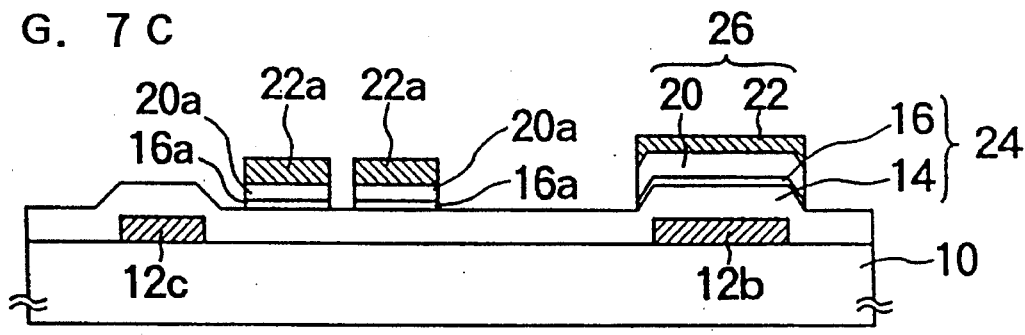
FIG. 7C is a sectional view (Part 5) of the inverse stag TFT matrix device of FIGS. 1 and 2C in steps of the method for fabricating the same.
Figure 7D:
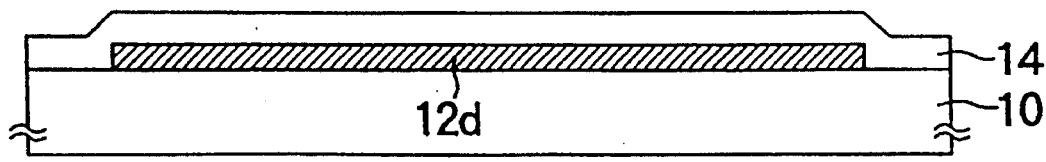
FIG. 7D is a sectional view (Part 5) of the inverse staggered TFT matrix device of FIGS. 1 and 2D in steps of the method for fabricating the same.
Figure 8A:
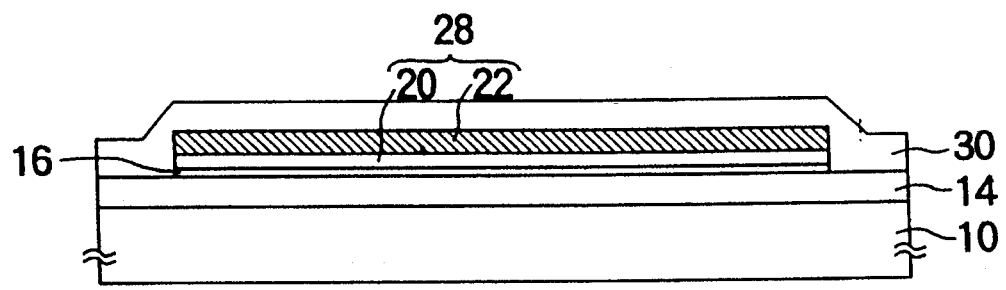
FIG. 8A is a sectional view (Part 6) of the inverse staggered TFT matrix device of FIGS. 1 and 2A in steps of the method for fabricating the same.
Figure 8B:
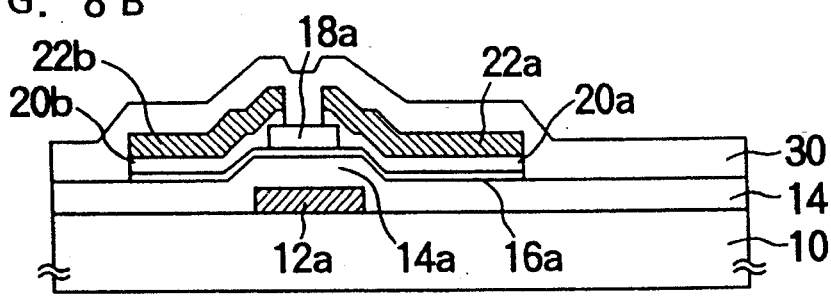
FIG. 8B is a sectional view (Part 6) of the inverse staggered TFT matrix device of FIGS. 1 and 2B in steps of the method for fabricating the same.
Figure 8C:
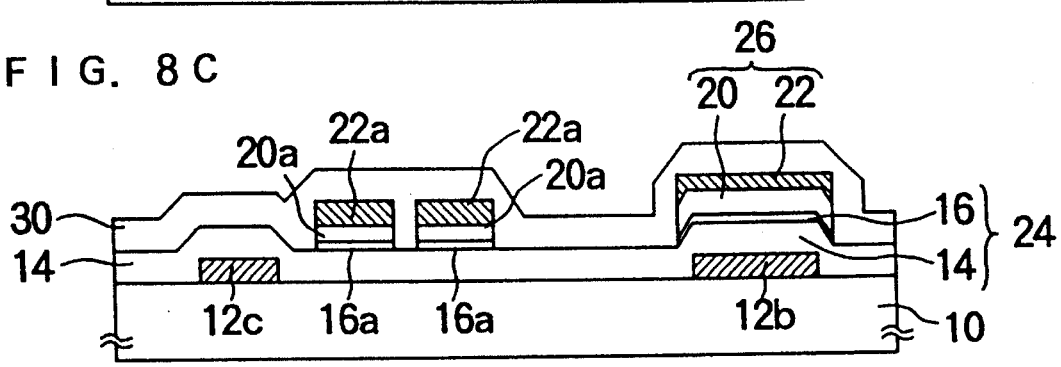
FIG. 8C is a sectional view (Part 6) of the inverse staggered TFT matrix device of FIGS. 1 and 2C in steps of the method for fabricating the same.
Figure 8D:
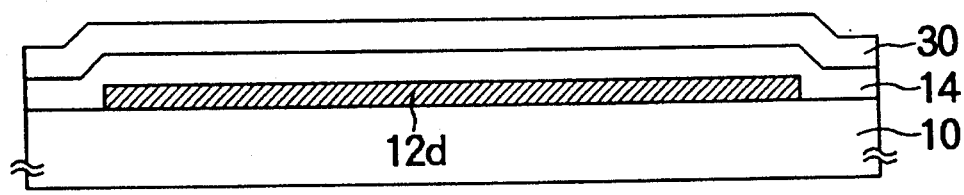
FIG. 8D is a sectional view (Part 6) of the inverse staggered TFT matrix device of FIGS. 1 and 2D in steps of the method for fabricating the same.
Figure 9A:
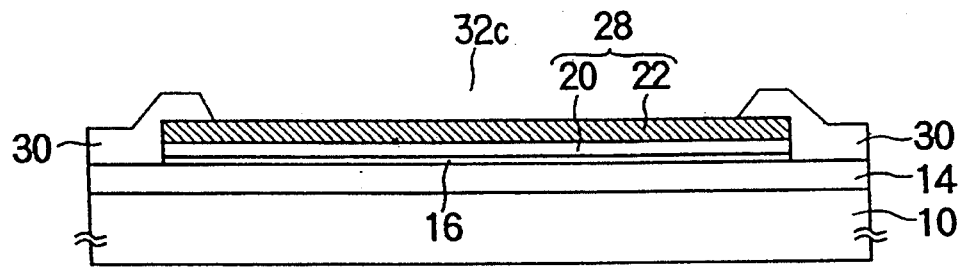
FIG. 9A is a sectional view (Part 7) of the inverse staggered TFT matrix device of FIGS. 1 and 2A in steps of the method for fabricating the same.
Figure 9B:
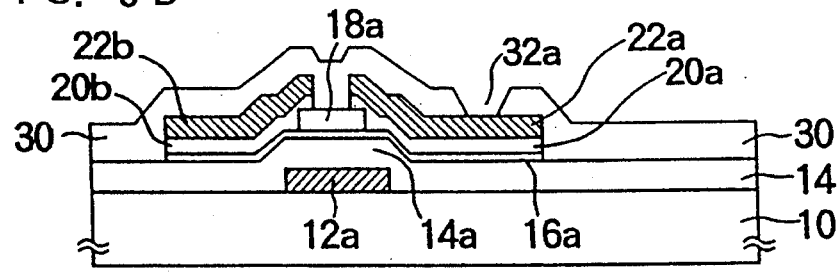
FIG. 9B is a sectional view (Part 7) of the inverse staggered TFT matrix device of FIGS. 1 and 2B in steps of the method for fabricating the same.
Figure 9C:
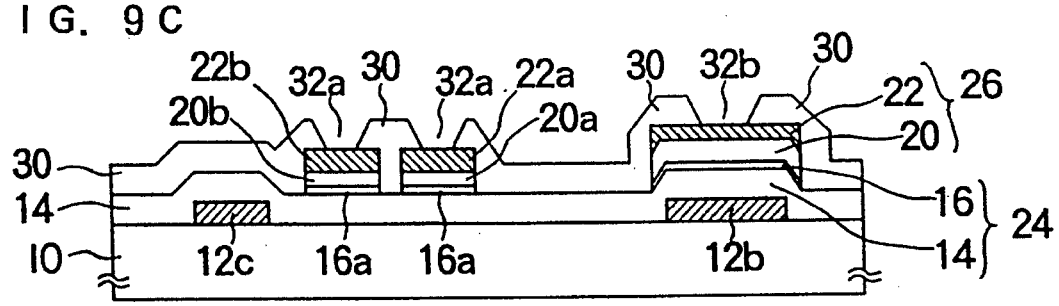
FIG. 9C is a sectional view (Part 7) of the inverse staggered TFT matrix device of FIGS. 1 and 2C in steps of the method for fabricating the same.
Figure 9D:
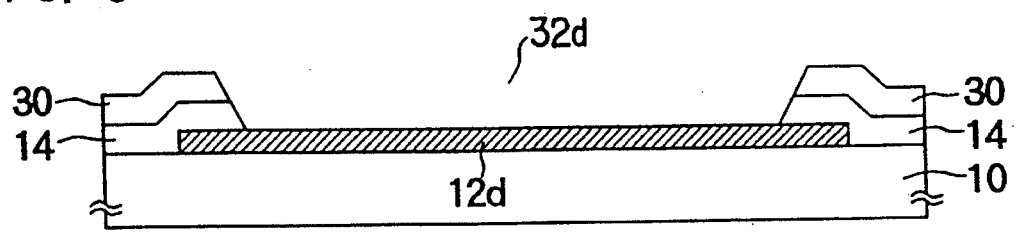
FIG. 9D is a sectional view (Part 7) of the inverse staggered TFT matrix device of FIGS. 1 and 2D in steps of the method for fabricating the same.
Figure 10A:
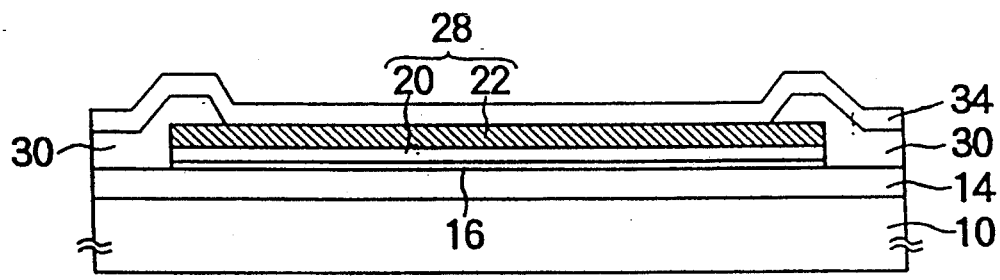
FIG. 10A is a sectional view (Part 8) of the inverse staggered TFT matrix device of FIGS. 1 and 2A in steps of the method for fabricating the same.
Figure 10B:
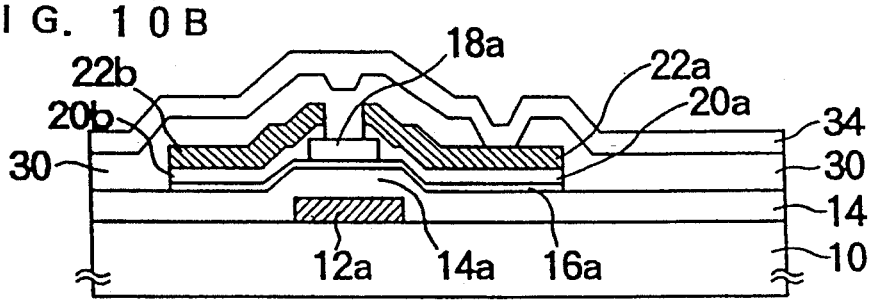
FIG. 10B is a sectional view (Part 8) of the inverse staggered TFT matrix device of FIGS. 1 and 2B in steps of the method for fabricating the same.
Figure 10C:
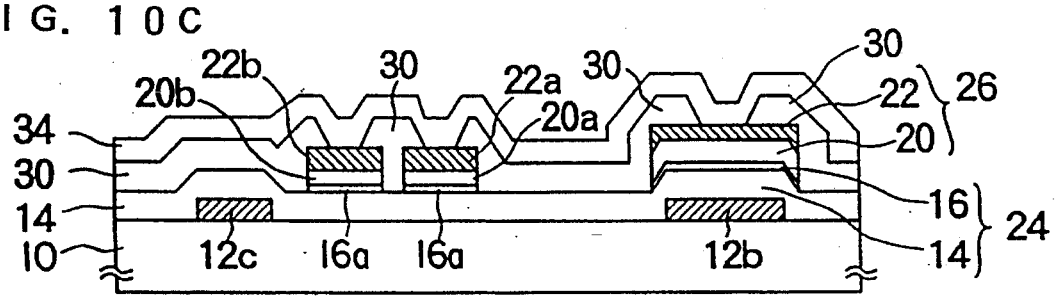
FIG. 10C is a sectional view (Part 8) of the inverse staggered TFT matrix device of FIGS. 1 and 2C in steps of the method for fabricating the same.
Figure 10D:
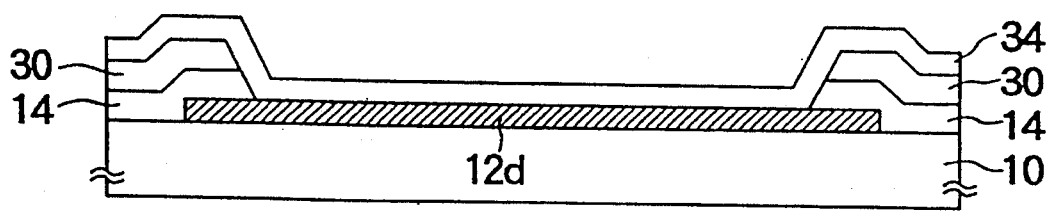
FIG. 10D is a sectional view (Part 8) of the inverse staggered TFT matrix device of FIGS. 1 and 2D in steps of the method for fabricating the same.
Figure 11A:
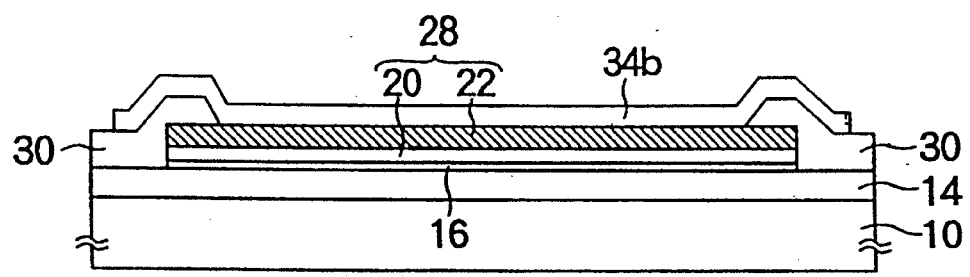
FIG. 11A is a sectional view (Part 9) of the inverse staggered TFT matrix device of FIGS. 1 and 2A in steps of the method for fabricating the same.
Figure 11B:
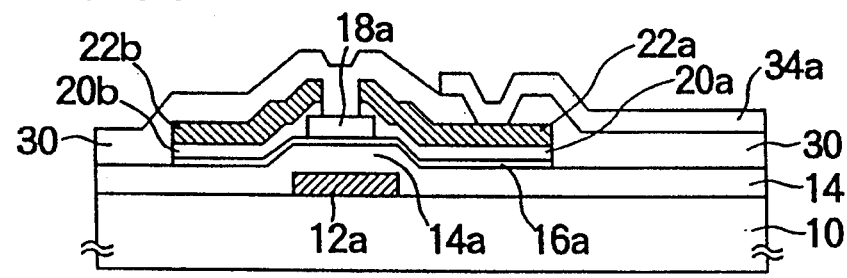
FIG. 11B is a sectional view (Part 9) of the inverse staggered TFT matrix device of FIGS. 1 and 2B in steps of the method for fabricating the same.
Figure 11C:
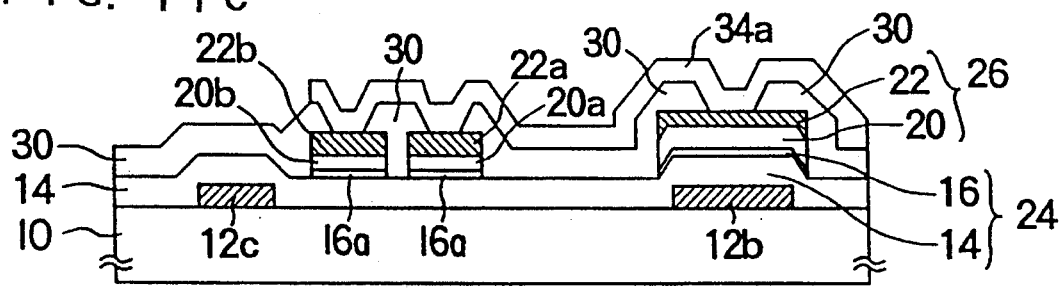
FIG. 11C is a sectional view (Part 9) of the inverse staggered TFT matrix device of FIGS. 1 and 2C in steps of the method for fabricating the same.
Figure 11D:
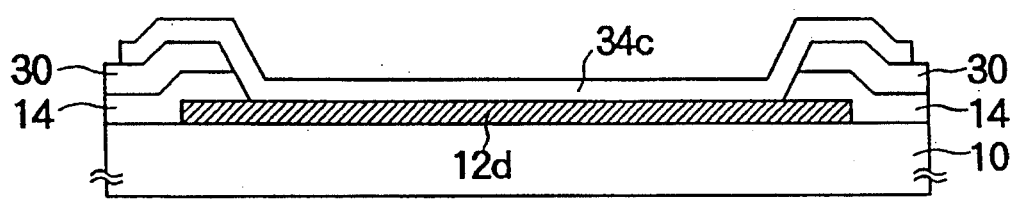
FIG. 11D is a sectional view (Part 9) of the inverse staggered TFT matrix device of FIGS. 1 and 2D in steps of the method for fabricating the same.

Next, the method for fabricating the inverse staggered TFT matrix device of FIGS. 1, 2A, 2B, 2C, and 2D will be explained with reference of FIGS. 3A to 11D which are sectional views of the inverse staggered TFT matrix device in the respective step of the method. FIGS. 3A, 4A, . . . , 11A represent the drain terminal unit, FIGS. 3B, 4B, . . . , 11B represent the TFT unit, FIGS. 3C, 4C, . . . , 11C represent the picture element unit and the storage capacitance unit, and FIGS. 3D, 4D, . . . , 11D represent the gate terminal unit respectively along the line A—A' section, the B—B' section, C—C' section and the D—D' section in FIG. 1.

A metal layer of, e.g., Al, Cr or others, is formed by sputtering on the transparent insulating substrate 10. A required resist pattern is formed on the metal layer, and then with the resist pattern as a mask, the metal layer is etched to form the gate electrode 12a, the Cs electrode 12b, the gate bus line 12c connected to the gate electrode 12a, and the gate terminal lower electrode 12d connected to the gate bus line 12c.

The metal layer may be formed of any material other than Al and Cr as long as it is able to be sufficiently etched with respect to the insulating film to be formed on the entire surface in the next step (FIGS. 3A to 3D).

Then, the insulating film 14 is formed of a SiN film or two layers of an SiN film and a SiO$_2$ film in an about 400 nm-thickness on the entire surface by plasma CVD. Here, the part of the insulating film 14 on the gate electrode 12a is especially called the gate insulating film 14a.

Then, on the insulating film 14, the non-doped i-type a-Si layer 16, and the protecting film 18 of SiO$_2$ film or SiN film are formed in the stated order respectively in a 20 nm-thickness and a 150 nm-thickness by plasma CVD (FIGS. 4A to 4D).

Then, the protecting film 18 except a part thereof on the TFT channel unit is etched off using hydrofluoric acid buffer or others. That is, the protecting film 18 is left only above the gate electrode 12a of the TFT unit to form the channel protecting film 18a (FIGS. 5A to 5D).

Subsequently, the n$^+$-type a-Si layer 20 is formed in a 60 nm-thickness on the entire surface by plasma CVD, and the metal film 22 of, e.g., Al, Cr or others is formed in a 200 nm-thickness by sputtering (FIGS. 6A to 6D).

Then, a required resist pattern is formed on the metal layer 22, and then with the resist pattern as a mask, the metal layer 22, the n$^+$-type a-Si layer 20 and the i-type a-Si layer 16 are sequentially etched. Thus, the a-Si active layer 16a of the i-type a-Si layer 16 is formed on the gate insulating film 14a of the TFT unit, while the source electrode 22a and the drain electrode 22b of the metal layer 22 connected to the a-Si active layer 16a respectively through the n$^+$-type a-Si contact layer 20a, 20b of the n$^+$-type a-Si layer 20 on both sides of the channel protecting film 18a are formed opposed to each other, and the TFT is completed.

At the same time, the counter electrode 26 comprising the n$^+$-type a-Si layer 20 and the metal layer 22 is formed on the Cs electrode 12b of the storage capacitance unit through the dielectric film 24 comprising the insulating film 14 and the i-type a-Si layer 16.

In the drain terminal unit, the drain terminal lower electrode 28 comprising the n$^+$-type a-Si layer 20 and the metal layer 22 connected to the drain electrode 22b through the drain bus line (not shown), is formed (FIGS. 7A to 7D).

Then, the passivation film 30 of SiO$_2$ film, SiN film or their composite film is formed in a 400 nm-thickness on the entire surface by CVD or sputtering to cover the TFT (FIGS. 8A to 8D).

Then, a resist is applied, and a resist pattern having openings on the source electrode 22a, the counter electrode 26, the drain terminal lower electrode 28, and the gate terminal lower electrode 12d is formed by photolithography. With the resist pattern as a mask, the passivation film 30, or the passivation film 30 and the insulating film 14 are etched to open the contact holes 32a, 32b, 32c, 32d.

For this etching, it is preferable that the passivation film 30, or the passivation film 30 and the insulating film 14 are taper-etched. This is because the source electrode 22a, the counter electrode 26, the drain terminal lower electrode 28 and the gate terminal lower electrode 12d exposed in the contact holes 32a, 32b, 32c, 32d, and the transparent conducting film of ITO or others, which is to be formed in the next step, must be electrically connected. The tapered-etching may be wet etching using hydrofluoric acid buffer, RIE (reactive ion etching) using CF$_4$ gas or others (FIGS. 9A to 9D).

Then, the transparent conducting film 34 of ITO or others is formed on the entire surface in a 100 nm-thickness by sputtering (FIGS. 10A to 10D).

Then, the transparent conducting film 34 is patterned as required to form the picture element electrode 34a connected to the source electrode 22a and the counter electrode 26 through the contact holes 32a, 32b. At the same time, the drain terminal upper electrode 34b connected to the drain terminal lower electrode 28 through the contact hole 32c is formed, and the gate terminal upper electrode 34c connected to the gate terminal lower electrode 12d through the contact hole 32d is formed.

Thus, are formed the picture element unit comprising the picture element electrode 34a connected to the source electrode 22a of the TFT unit, the storage capacitance unit comprising the counter electrode 26c connected to the picture element electrode 34a, the Cs electrode 12b and the dielectric film 24 held between both electrodes, the drain terminal unit comprising the drain terminal upper electrode 34b and the drain terminal lower electrode 28 connected to the drain electrode 22b of the TFT unit through the drain bus line, and the gate terminal unit comprising the gate terminal upper electrode 34d and the gate terminal lower electrode 12d connected to the gate electrode 12a of the TFT unit through the gate bus line 12 (FIGS. 11A to 11D).

According to this embodiment, in forming the gate terminal unit, the gate terminal lower electrode 12d of the metal film of Al, Cr or others is formed on the transparent insulating substrate 10 concurrently with the gate electrode 12a and the gate bus line 12c (FIGS. 3A to 3D), the insulating film 14 common with the gate insulating film 14a is formed on the gate terminal lower electrode 12d (FIGS. 4A to 4D), the passivation film 30 for covering the TFT is formed on the insulating film 14 (FIGS. 8A to 8D), the passivation film 30 and the insulating film 14 are etched to form the contact hole 32d (FIGS. 9A to 9D), the gate terminal upper electrode 34d of the transparent conducting film connected to the gate terminal lower electrode 12d through the contact hole 32d is formed concurrently with the picture element electrode 34a (FIGS. 10A to 11D).

This fabrication process will be compared with that of a conventional fabrication method, i.e., the fabrication process which requires two steps of opening windows, that is, the step of selectively etching the insulating film 54 on the gate terminal lower electrode 52d to open the contact hole 66 (FIGS. 24A to 24D), and the step of selectively etching the passivation film 70 on the gate terminal upper electrode 68c to open the window 72c to finally expose the gate terminal (FIGS. 28A to 28D). The sequence of the step of forming the passivation film 30 and the step of forming the transparent conducting film 34 to form the gate terminal upper electrode 34c is reversed, whereby the insulating film 14 and the passivation film 30 on the gate terminal lower electrode 12d can be opened by a single window opening step. That is, the two window opening steps can be reduced to a single window opening step. The fabrication steps of the TFT matrix device can be accordingly simplified, and lower costs can be realized.

In forming the storage capacitance unit, the Cs electrode 12b of the metal film of Al, Cr or others is formed concurrently with the gate electrode 12a, etc. (FIGS. 3A to 3D), and the insulating film 14, the non-doped i-type a-Si film 16 are formed on the gate electrode 12a (FIGS. 4A to 4D), the n$^+$-type a-Si layer 20 and the metal film 22 are formed on the i-type a-Si layer 16 (FIGS. 6A to 6D), and the dielectric film 24 of the insulating film 14 and the i-type a-Si layer 16, and the counter electrode 26 of the n$^+$-type a-Si layer 20 and the metal layer 22 are formed (FIGS. 7A to 7D). The contact hole 32b is opened in the passivation film 30 on the counter electrode 26 (FIGS. 9A to 9D), and the picture element electrode 34a connected to the counter electrode 26 through the contact hole 32b is formed (FIGS. 11A to 11D).

Thus, the i-type a-Si layer 16 covering the insulating film 14 on the gate electrode 12a is a part of the dielectric film 24, and the insulating film 14 protects the dielectric film 24 from direct exposure to the etchant. So that, changes of a storage capacitance due to changes of a thickness of the dielectric film 24 can be prevented. Even when there are pin holes in a part of the insulating film 14, the presence of the i-type a-Si layer 16 covering the insulating film 14 can prevent defective insulation of the dielectric film 24, whereby defective displays due to current leakage and short circuits can be prevented.

A storage capacity of the storage capacitance unit comprising the counter electrode 26 and the Cs electrode 12b holding the dielectric film 24 of the insulating film 14 and the i-type a-Si layer 16 therebetween is substantially the same as that of the conventional storage capacitance unit having the dielectric film formed of the insulating film 14 alone, because of a thickness of the i-type a-Si layer 16 as small as 20 nm.

The i-type a-Si layer 16 forming the dielectric film 24, and the counter electrode 26 of the $n^+$-type a-Si layer 20 and the metal film 22 on the i-type a-Si layer 16 are formed of the same material as the a-Si layer 16a, the $n^+$-type a-Si contact layers 20a, 20b, the source electrode 22a, the drain electrode 22b concurrently therewith (FIGS. 4A to 6D). The contact hole 32b through which the counter electrode 26 and the picture element electrode 34 are connected to each other is opened concurrently with the opening of the contact hole 32d, etc. in the gate terminal unit (FIGS. 9A to 9D). Thus, no additional step is necessary.

Accordingly, without additional step, occurrences of characteristic changes and defects of a storage capacitance of the storage capacitance unit can be prevented, and yields and reliability can be improved.

The inverse staggered TFT matrix device according to a second embodiment of this invention will be explained with reference to FIGS. 12, 13A, 13B, 13C, and 13D.

Figure 12:
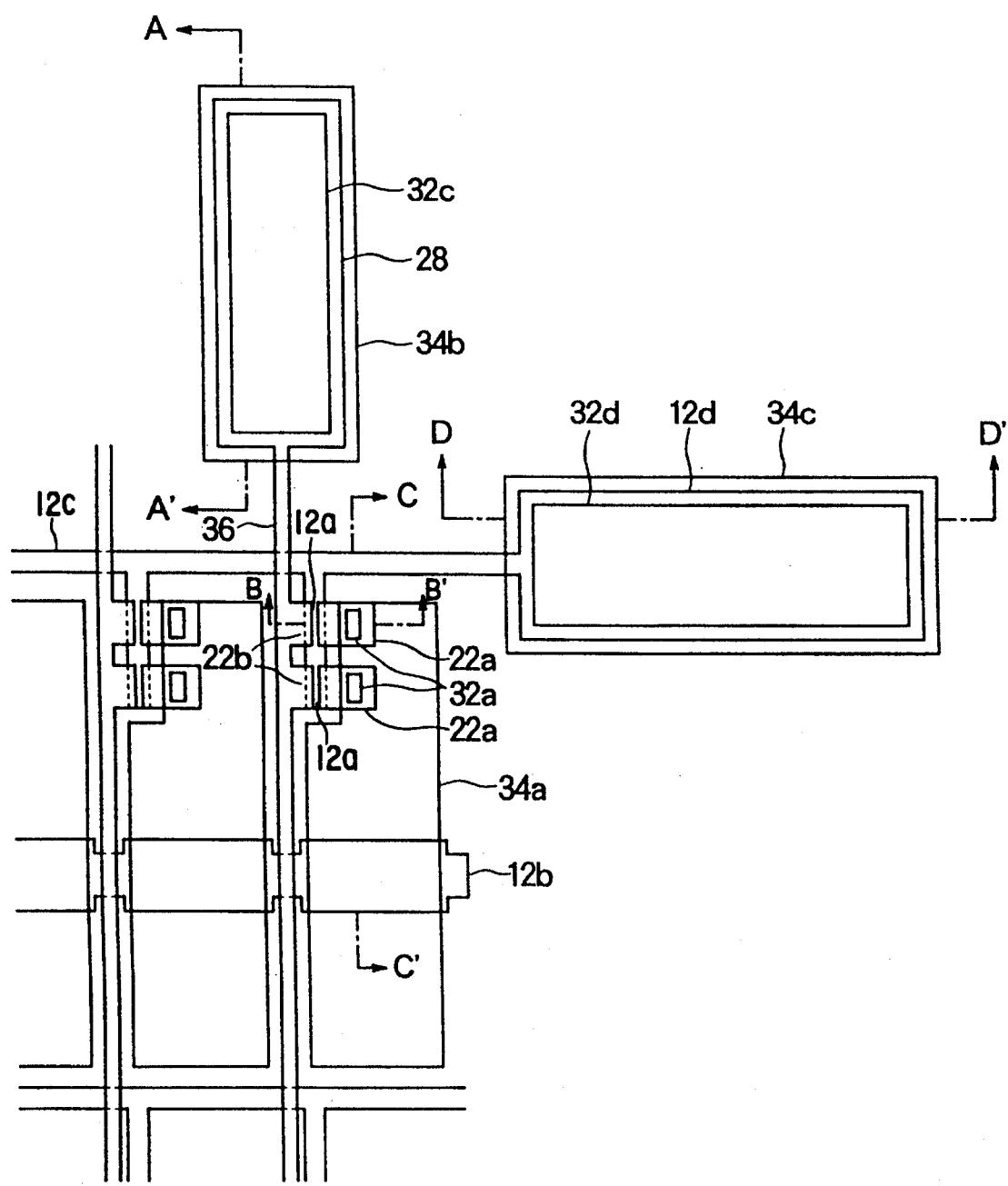
FIG. 12 is a plan view of the inverse staggered TFT matrix device according to a second embodiment of this invention.
Figure 13A:
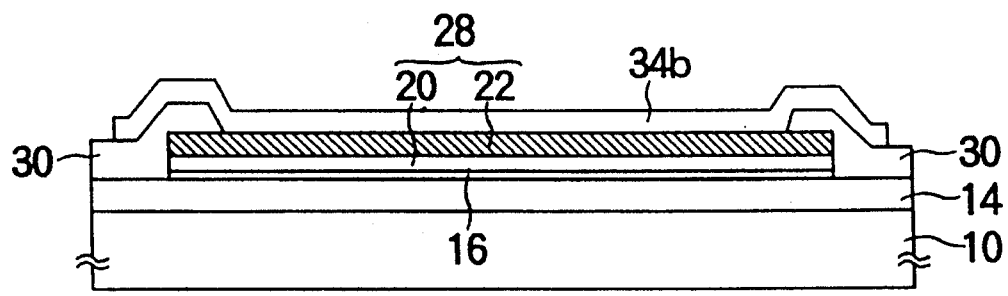
FIG. 13A is a sectional view of the drain terminal unit of the inverse staggered TFT matrix device of FIG. 12.
Figure 13B:
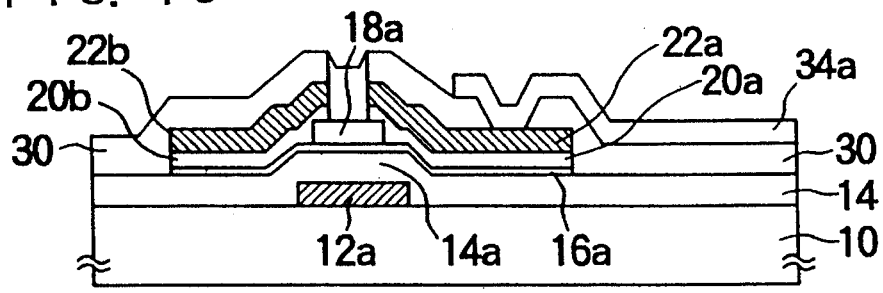
FIG. 13B is a sectional view of the TFT unit of the inverse staggered TFT matrix device of FIG. 12.
Figure 13C:
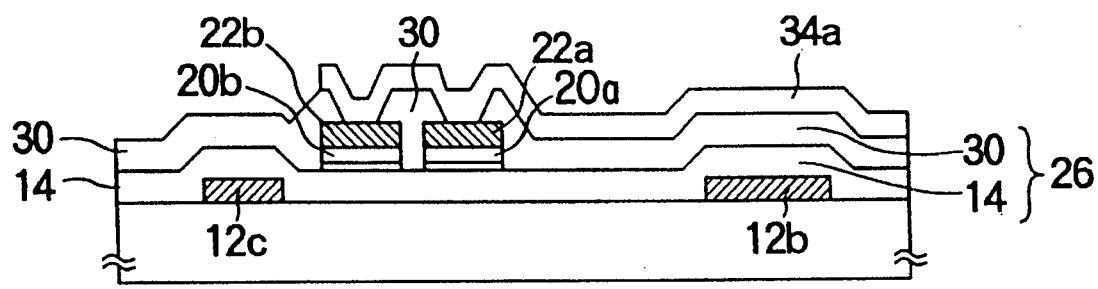
FIG. 13C is a sectional view of the picture element unit and the storage capacitance unit of the inverse staggered TFT matrix device of FIG. 12.
Figure 13D:
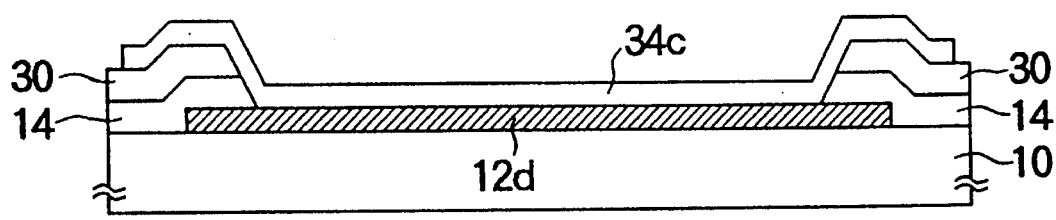
FIG. 13D is a sectional view of the gate terminal unit of the inverse staggered TFT matrix device of FIG. 12.

FIG. 12 is a plan view of the TFT matrix device according to the second embodiment of this invention. FIGS. 13A, 13B, 13C, and 13D are respectively sectional views of the drain terminal unit along the line A—A' in FIG. 12, the TFT unit along the line B—B' therein, the picture element unit and the storage capacitance unit along the line C—C' therein, and the gate terminal unit along the line D—D' therein. The common parts with the TFT matrix device of FIGS. 1, 2A, 2B, 2C, and 2D are represented by common reference numerals not to repeat their explanation.

The TFT matrix device according to the second embodiment has the same structures as that of FIGS. 1, 2A, 2B, 2C, and 2D according to the first embodiment in the drain terminal unit, the TFT unit, the picture element unit, and the gate terminal unit, but is different from the latter in the storage capacitance unit.

That is, this embodiment is the same as the first embodiment in that the Cs electrode 12b of metal film of the same material as the gate electrode 12a is formed on the transparent insulating substrate 10, but is different from the latter in that a dielectric film 38 comprising the passivation film 30 and the insulating film 14 common with the gate insulating film 14a is formed on the Cs electrode 12b, and the picture element electrode 34a is formed on the dielectric film 38. Thus, the storage capacitance unit comprises the picture element electrode 34a which functions as the counter electrode, and the Cs electrode 12b with the dielectric film 38 held therebetween.

Figure 14A:
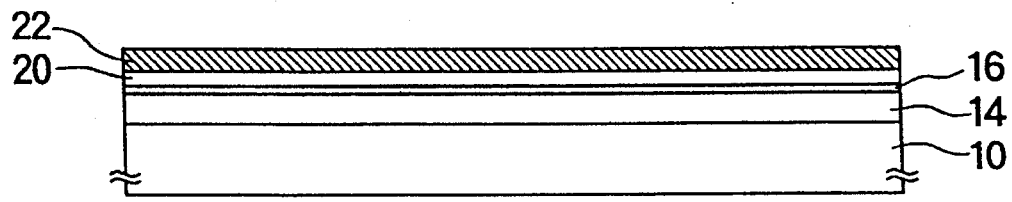
FIG. 14A is a sectional view (Part 1) of the inverse staggered TFT matrix device of FIGS. 12 and 13A in steps of the method for fabricating the same.
Figure 14B:
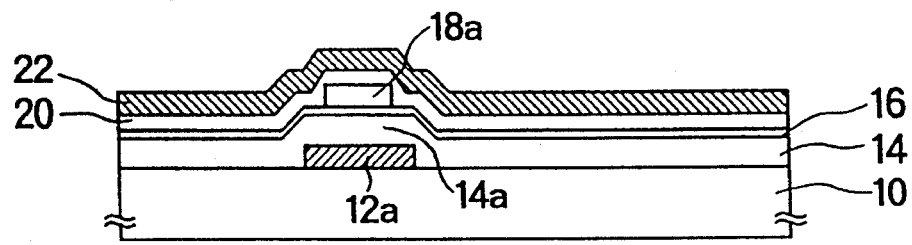
FIG. 14B is a sectional view (Part 1) of the inverse staggered TFT matrix device of FIGS. 12 and 13B in steps of the method for fabricating the same.
Figure 14C:
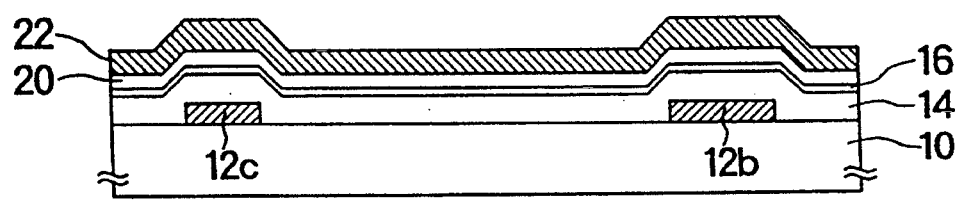
FIG. 14C is a sectional view (Part 1) of the inverse staggered TFT matrix device of FIGS. 12 and 13C in steps of the method for fabricating the same.
Figure 14D:
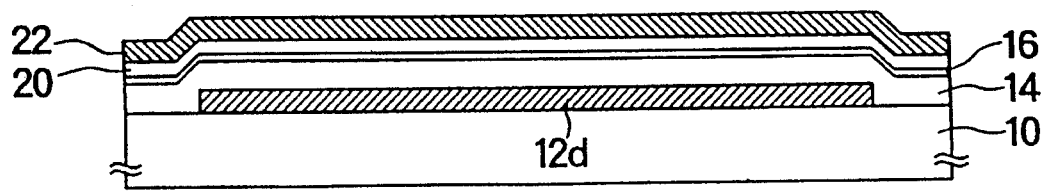
FIG. 14D is a sectional view (Part 1) of the inverse staggered matrix device of FIGS. 12 and 13D in steps of the method for fabricating the same.
Figure 15A:
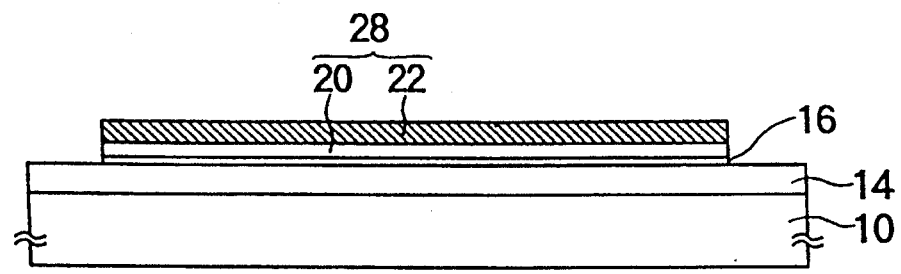
FIG. 15A is a sectional view (Part 2) of the inverse staggered TFT matrix device of FIGS. 12 and 13A in steps of the method for fabricating the same.
Figure 15B:
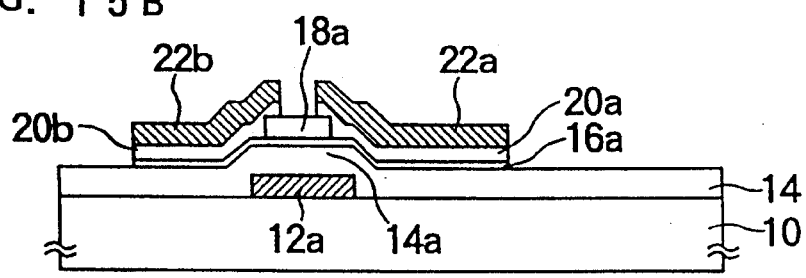
FIG. 15B is a sectional view (Part 2) of the inverse staggered TFT matrix device of FIGS. 12 and 13B in steps of the method for fabricating the same.
Figure 15C:
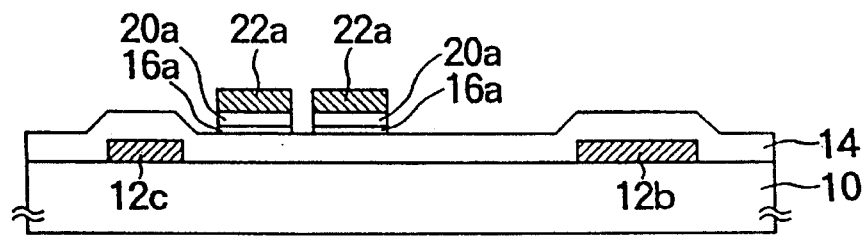
FIG. 15C is a sectional view (Part 2) of the inverse staggered matrix device of FIGS. 12 and 13C in steps of the method for fabricating the same.
Figure 15D:
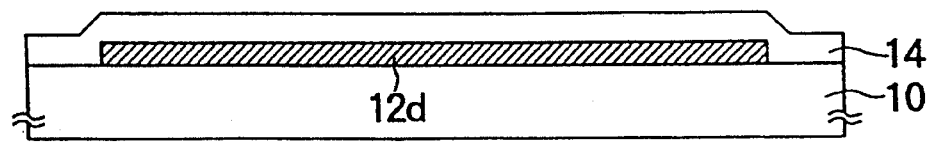
FIG. 15D is a sectional view (Part 2) of the inverse staggered TFT matrix device of FIGS. 12 and 13D in steps of the method for fabricating the same.
Figure 16A:
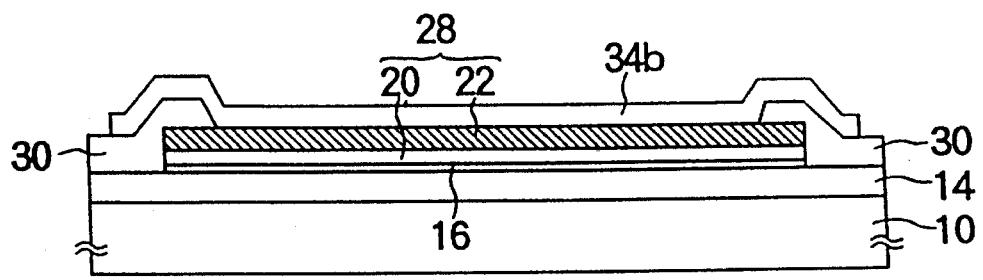
FIG. 16A is a sectional view (Part 3) of the inverse staggered TFT matrix device of FIGS. 12 and 13A in steps of the method for fabricating the same.
Figure 16B:
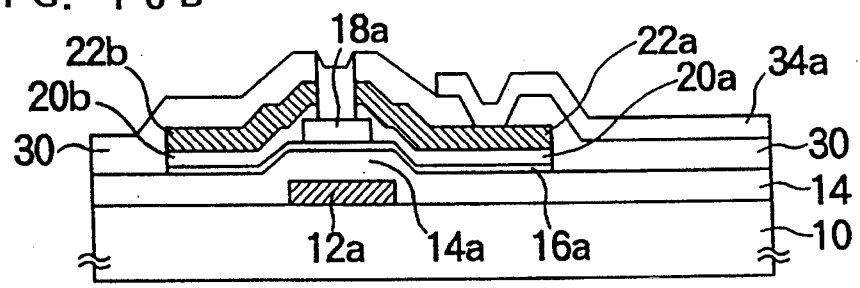
FIG. 16B is a sectional view (Part 3) of the inverse staggered TFT matrix device of FIGS. 12 and 13B in steps of the method for fabricating the same.
Figure 16C:
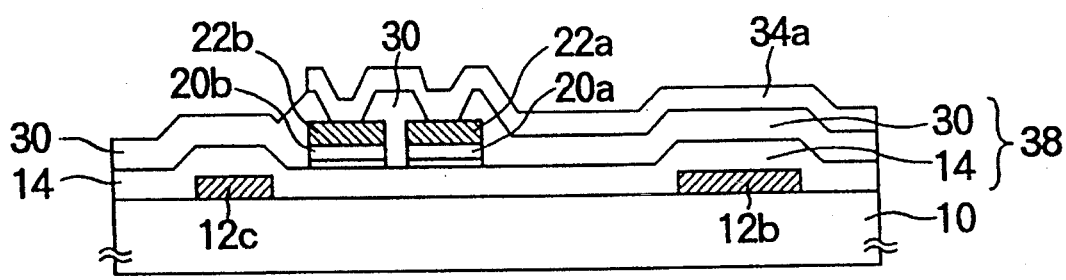
FIG. 16C is a sectional view (Part 3) of the inverse staggered TFT matrix device of FIGS. 12 and 13C in steps of the method for fabricating the same.
Figure 16D:
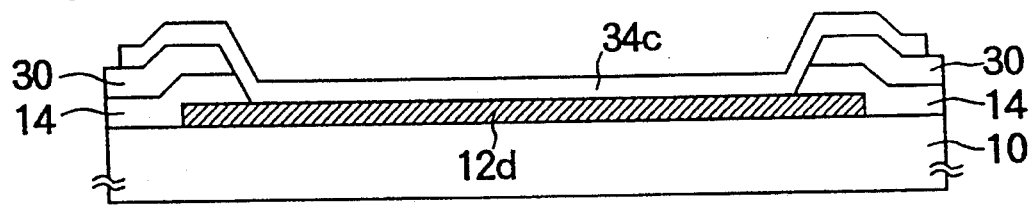
FIG. 16D is a sectional view (Part 3) of the inverse staggered TFT matrix device of FIGS. 12 and 13D in steps of the method for fabricating the same.
Figure 17:
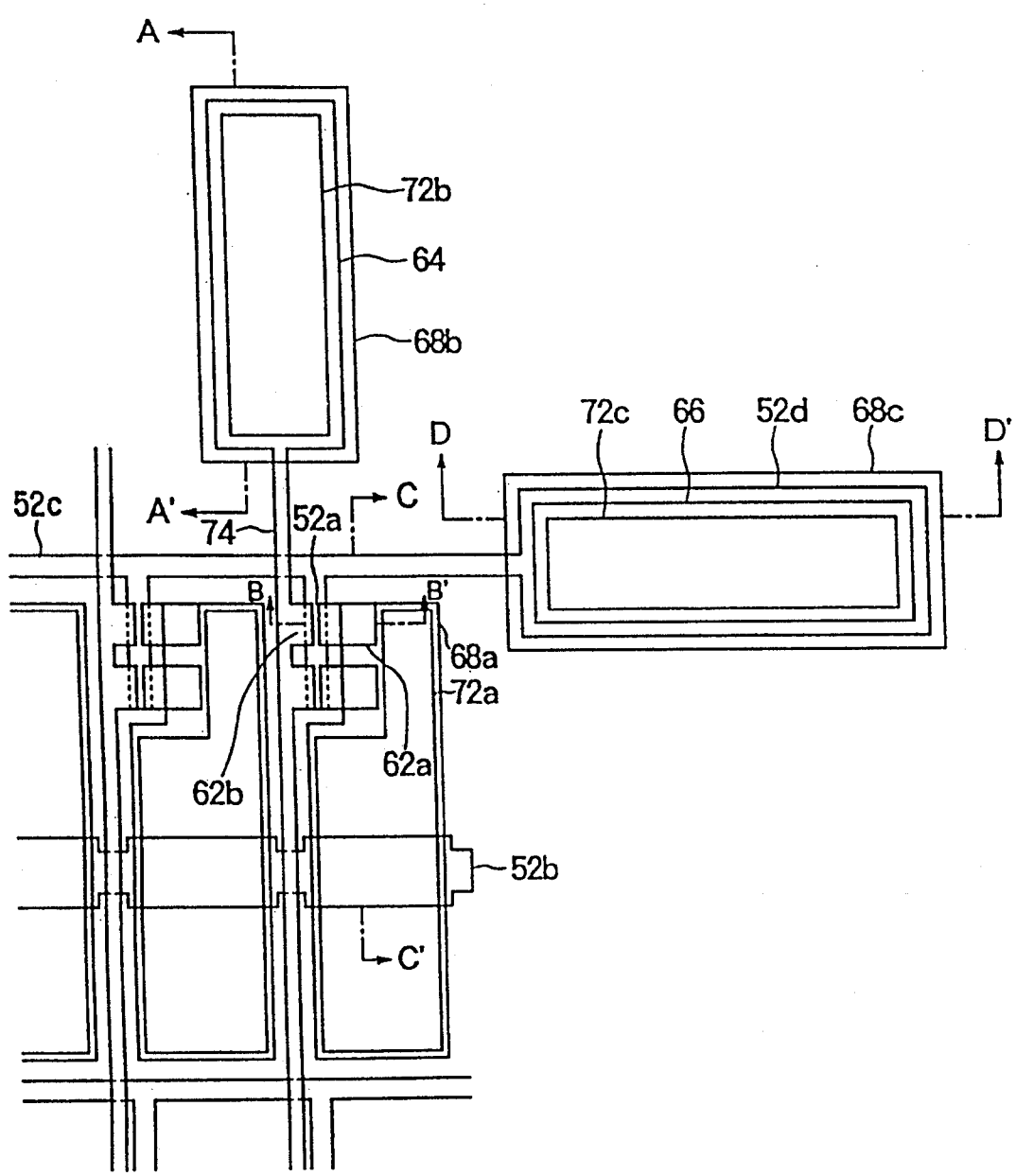
FIG. 17 is a plan view of a conventional inverse staggered TFT matrix deice.
Figure 18A:
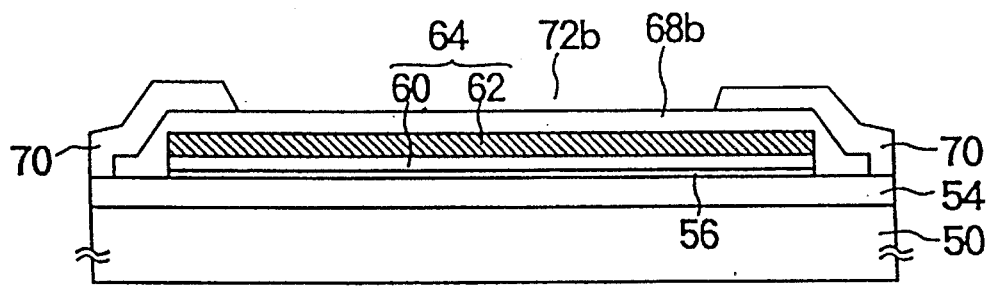
FIG. 18A is a sectional view of the drain terminal unit of the inverse staggered TFT matrix device of FIG. 17.
Figure 18B:
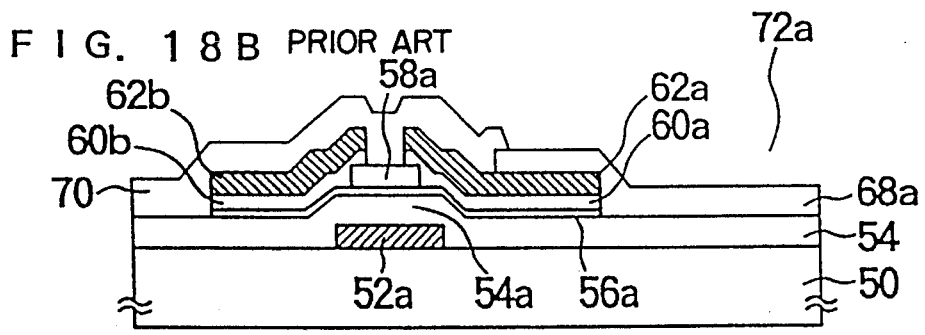
FIG. 18B is a sectional view of the TFT unit of the inverse staggered TFT matrix device of FIG. 17.
Figure 18C:
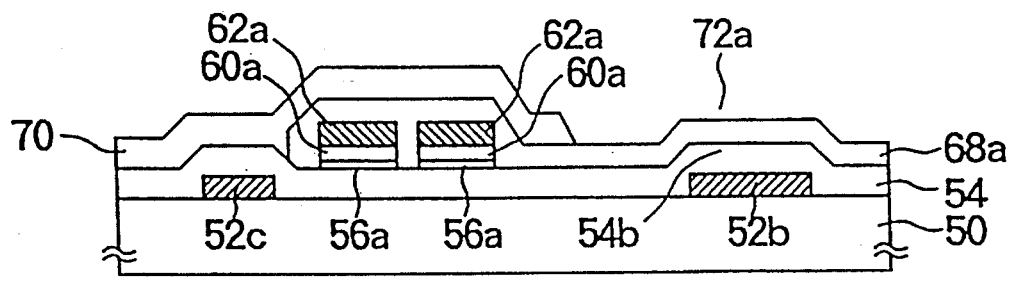
FIG. 18C is a sectional view of the picture element unit and the storage capacitance unit of the inverse staggered TFT matrix device of FIG. 17.
Figure 18D:
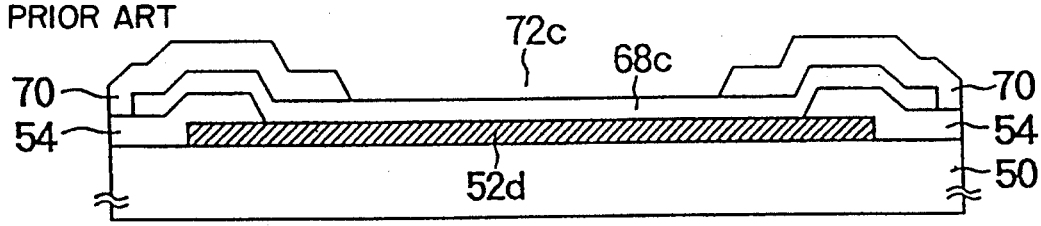
FIG. 18D is a sectional view of the gate terminal unit of the inverse staggered TFT matrix device of FIG. 17.
Figure 19A:
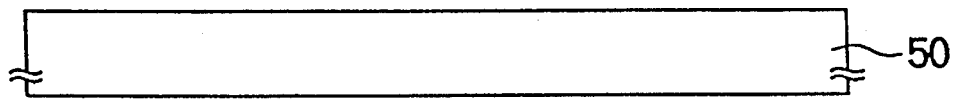
FIG. 19A is a sectional view (Part 1) of the inverse staggered matrix device of FIGS. 17 and 18A in steps of the method for fabricating the same.
Figure 19B:
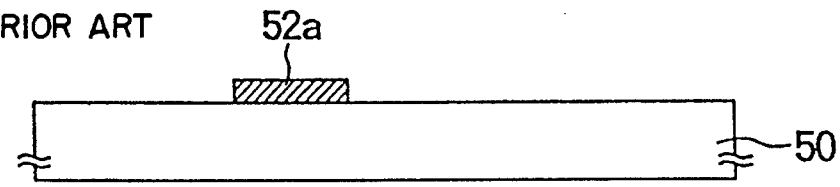
FIG. 19B is a sectional view (Part 1) of the inverse staggered TFT matrix device of FIGS. 17 and 18B in steps of the method for fabricating the same.
Figure 19C:
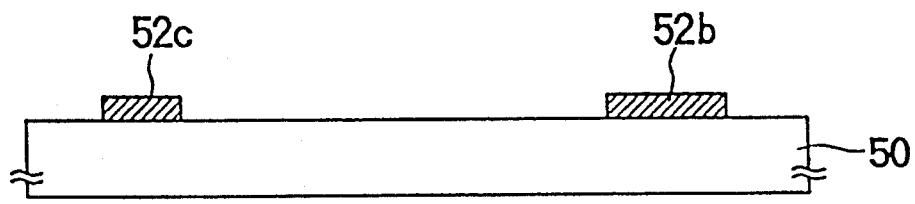
FIG. 19C is a sectional view (Part 1) of the inverse staggered matrix device of FIGS. 17 and 18C in steps of the method for fabricating the same.
Figure 19D:
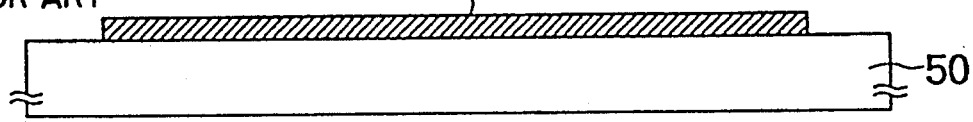
FIG. 19D is a sectional view (Part 1) of the inverse staggered matrix device of FIGS. 17 and 18D in steps of the method for fabricating the same.
Figure 20A:
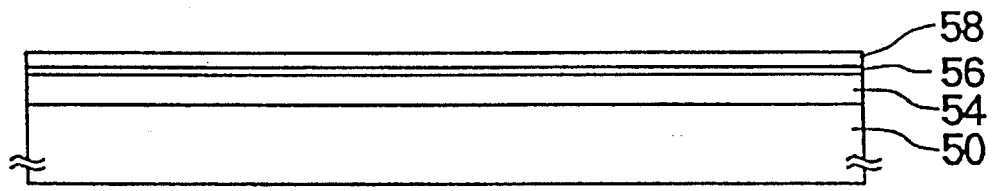
FIG. 20A is a sectional view (Part 2) of the inverse staggered TFT matrix device of FIGS. 17 and 18A in steps of the method for fabricating the same.
Figure 20B:
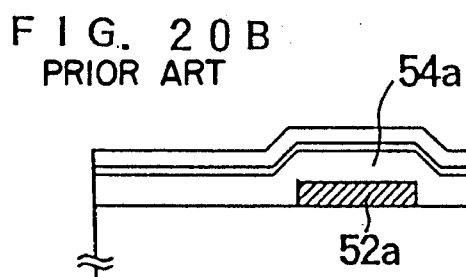
FIG. 20B is a sectional view (Part 2) of the inverse staggered TFT matrix device of FIGS. 17 and 18B in steps of the method for fabricating the same.
Figure 20C:
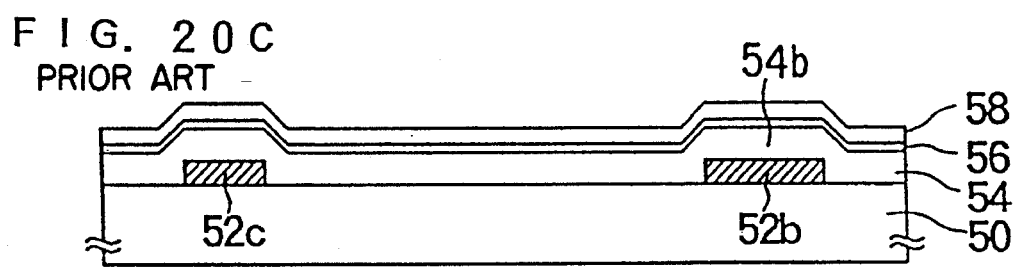
FIG. 20C is a sectional view (Part 2) of the inverse staggered TFT matrix device of FIGS. 17 and 18C in steps of the method for fabricating the same.
Figure 20D:
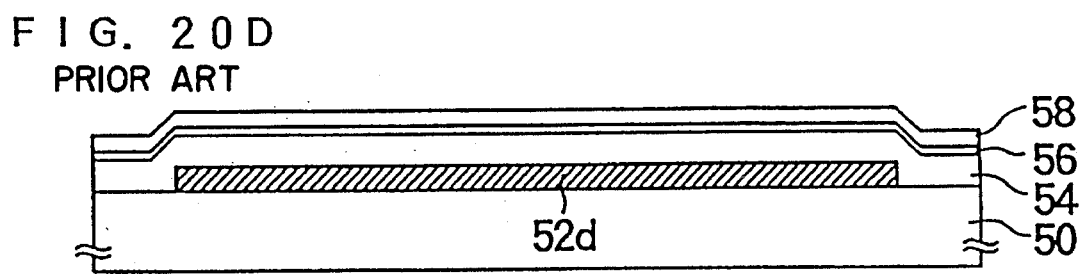
FIG. 20D is a sectional view (Part 2) of the inverse staggered TFT matrix device of FIGS. 17 and 18D in steps of the method for fabricating the same.
Figure 21A:
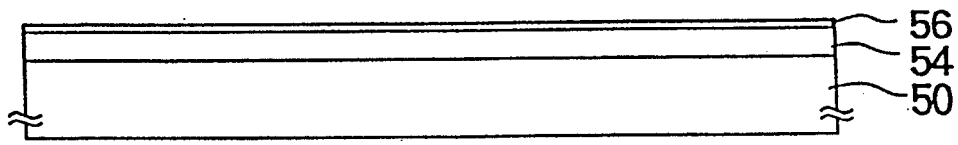
FIG. 21A is a sectional view (Part 3) of the inverse staggered TFT matrix device of FIGS. 17 and 18A in steps of the method for fabricating the same.
Figure 21B:
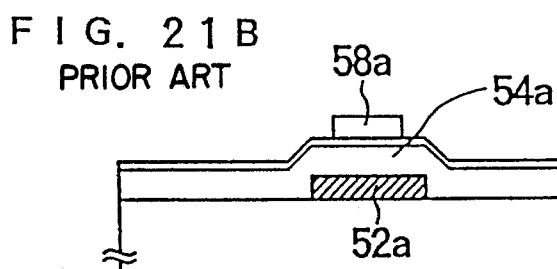
FIG. 21B is a sectional view (Part 3) of the inverse staggered matrix device of FIGS. 17 and 18B in steps of the method for fabricating the same.
Figure 21C:
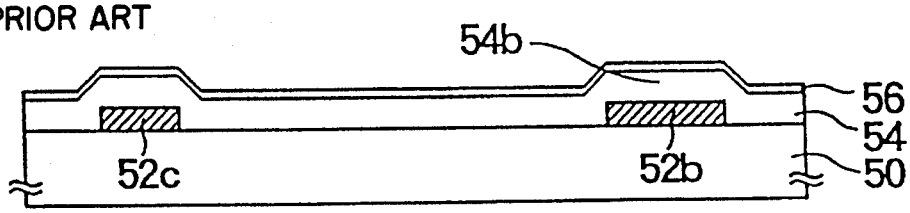
FIG. 21C is a sectional view (Part 3) of the inverse staggered TFT matrix device of FIGS. 17 and 18C in steps of the method for fabricating the same.
Figure 21D:
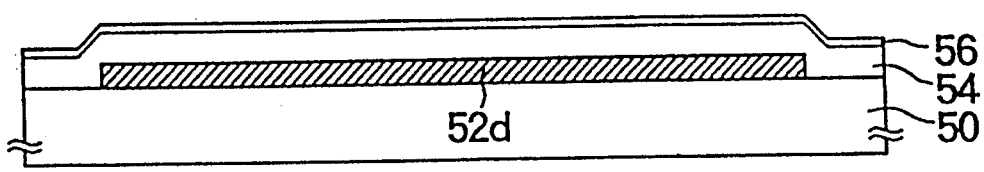
FIG. 21D is a sectional view (Part 3) of the inverse staggered TFT matrix device of FIGS. 17 and 18D in steps of the method for fabricating the same.
Figure 22A:
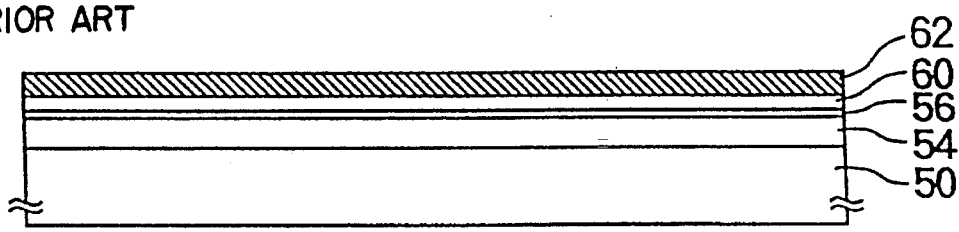
FIG. 22A is a sectional view (Part 4) of the inverse staggered TFT matrix device of FIGS. 17 and 18A in steps of the method for fabricating the same.
Figure 22B:
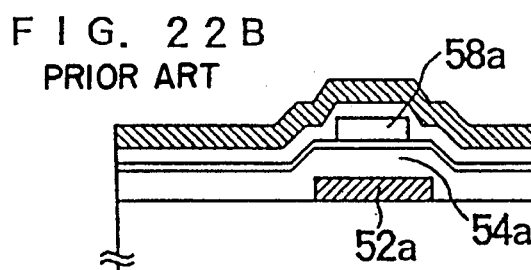
FIG. 22B is a sectional view (Part 4) of the inverse staggered TFT matrix device of FIGS. 17 and 18B in steps of the method for fabricating the same.
Figure 22C:
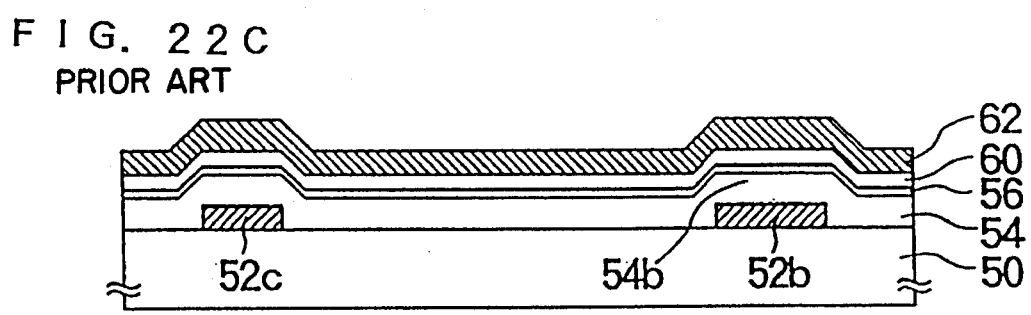
FIG. 22C is a sectional view (Part 4) of the inverse staggered TFT matrix device of FIGS. 17 and 18C in steps of the method for fabricating the same.
Figure 22D:
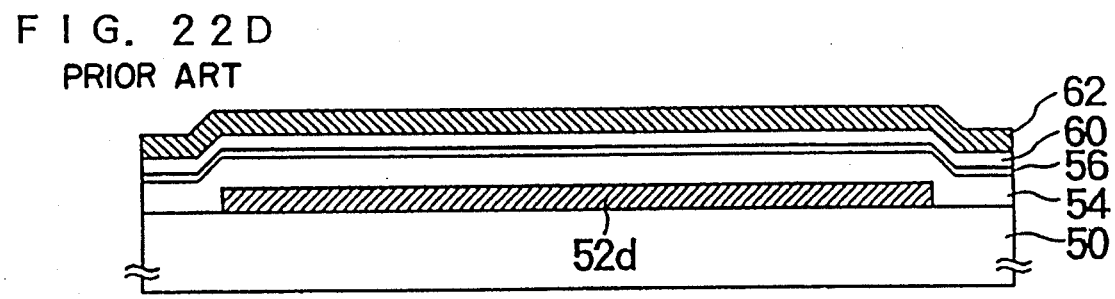
FIG. 22D is a sectional view (Part 4) of the inverse staggered TFT matrix device of FIGS. 17 and 18D in steps of the method for fabricating the same.
Figure 23A:
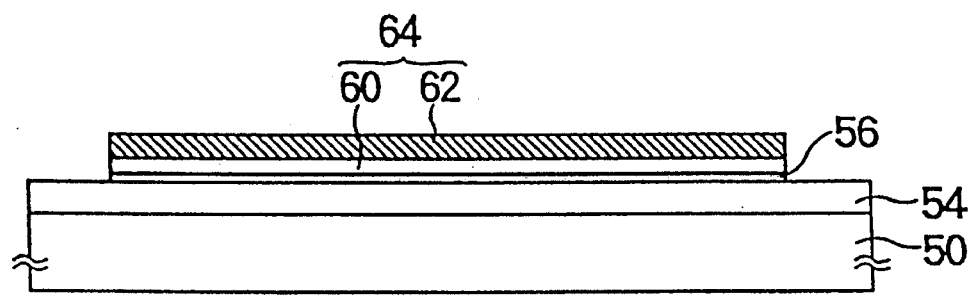
FIG. 23A is a sectional view (Part 5) of the inverse staggered TFT matrix device of FIGS. 17 and 18A in steps of the method for fabricating the same.
Figure 23B:
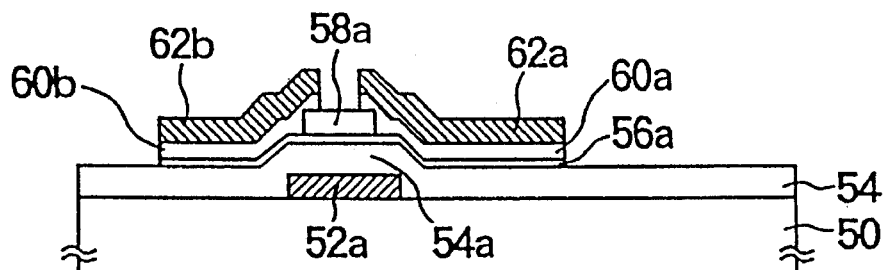
FIG. 23B is a sectional view (Part 5) of the inverse staggered TFT matrix device of FIGS. 17 and 18B in steps of the method for fabricating the same.
Figure 23C:
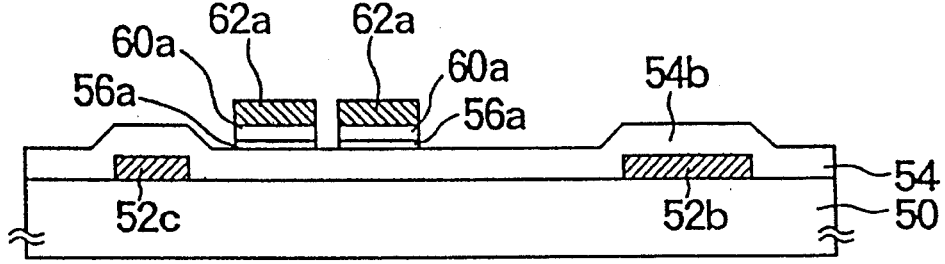
FIG. 23C is a sectional view (Part 5) of the inverse staggered TFT matrix device of FIGS. 17 and 18C in steps of the method for fabricating the same.
Figure 23D:
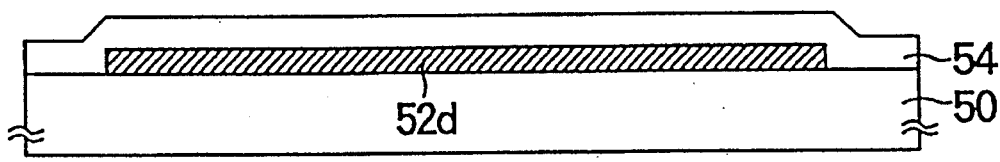
FIG. 23D is a sectional view (Part 5) of the inverse staggered TFT matrix device of FIGS. 17 and 18D in steps of the method for fabricating the same.
Figure 24A:
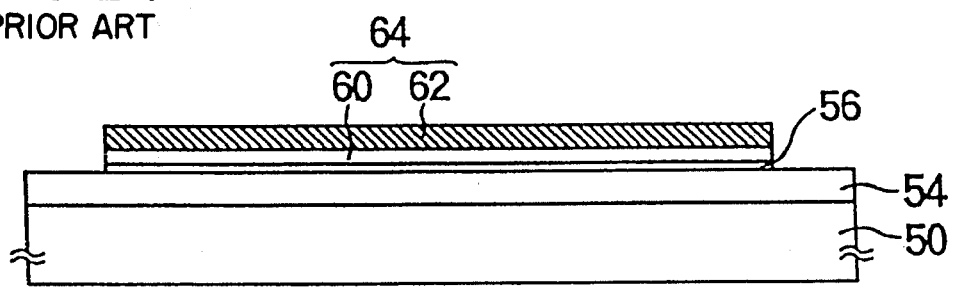
FIG. 24A is a sectional view (Part 6) of the inverse staggered TFT matrix device of FIGS. 17 and 18A in steps of the method for fabricating the same.
Figure 24B:
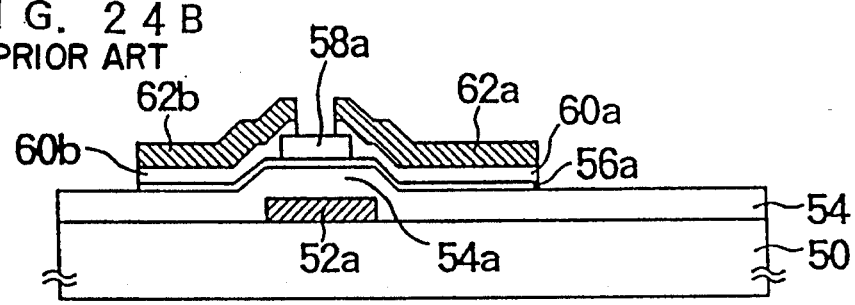
FIG. 24B is a sectional view (Part 6) of the inverse staggered TFT matrix device of FIGS. 17 and 18B in steps of the method for fabricating the same.
Figure 24C:
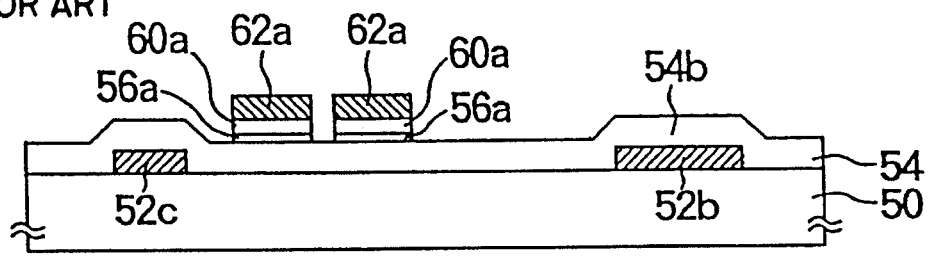
FIG. 24C is a sectional view (Part 6) of the inverse staggered TFT matrix device of FIGS. 17 and 18C in steps of the method for fabricating the same.
Figure 24D:
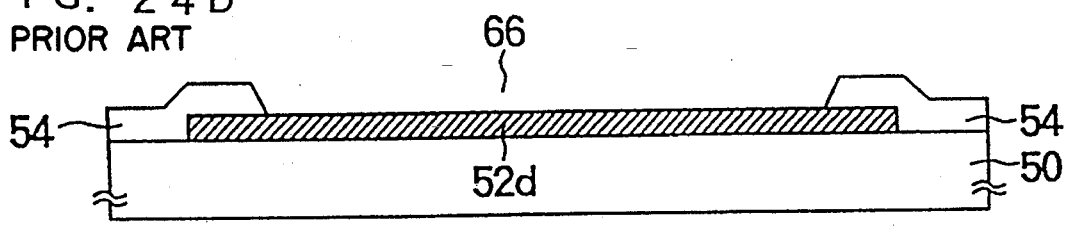
FIG. 24D is a sectional view (Part 6) of the inverse staggered TFT matrix device of FIGS. 17 and 18D in steps of the method for fabricating the same.
Figure 25A:
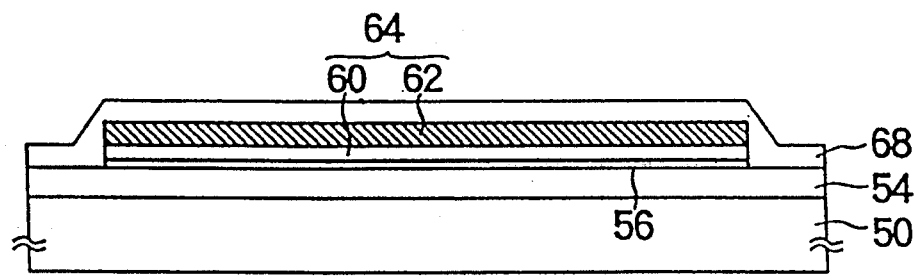
FIG. 25A is a sectional view (Part 7) of the inverse staggered TFT matrix device of FIGS. 17 and 18A in steps of the method for fabricating the same.
Figure 25B:
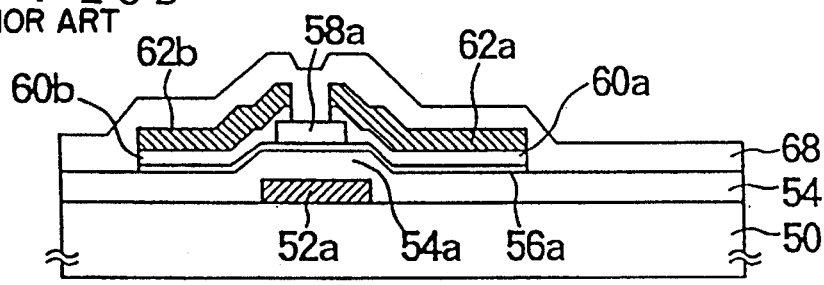
FIG. 25B is a sectional view (Part 7) of the inverse staggered matrix device of FIGS. 17 and 18B in steps of the method for fabricating the same.
Figure 25C:
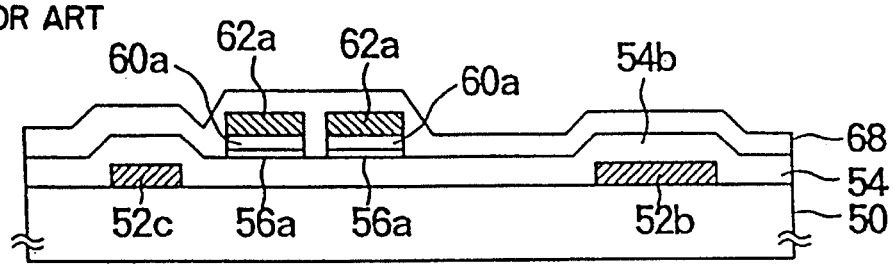
FIG. 25C is a sectional view (Part 7) of the inverse staggered TFT matrix device of FIGS. 17 and 18C in steps of the method for fabricating the same.
Figure 25D:
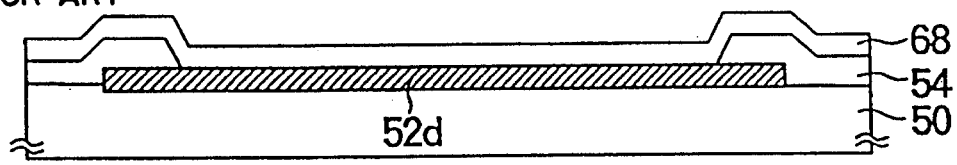
FIG. 25D is a sectional view (Part 7) of the inverse staggered TFT matrix device of FIGS. 17 and 18D in steps of the method for fabricating the same.
Figure 26A:
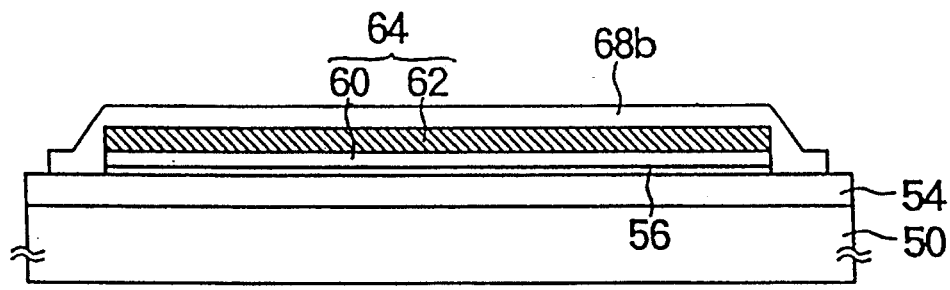
FIG. 26A is a sectional view (Part 8) of the inverse staggered matrix device of FIGS. 17 and 18A in steps of the method for fabricating the same.
Figure 26B:
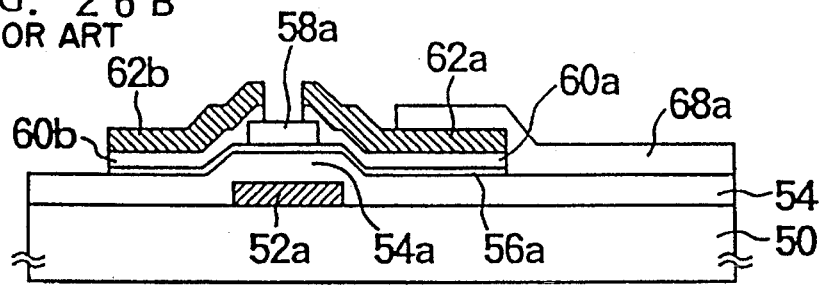
FIG. 26B is a sectional view (Part 8) of the inverse staggered TFT matrix device of FIGS. 17 and 18B in steps of the method for fabricating the same.
Figure 26C:
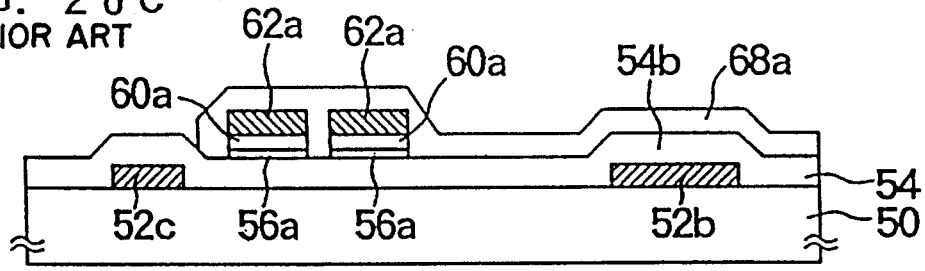
FIG. 26C is a sectional view (Part 8) of the inverse staggered TFT matrix device of FIGS. 17 and 18C in steps of the method for fabricating the same.
Figure 26D:
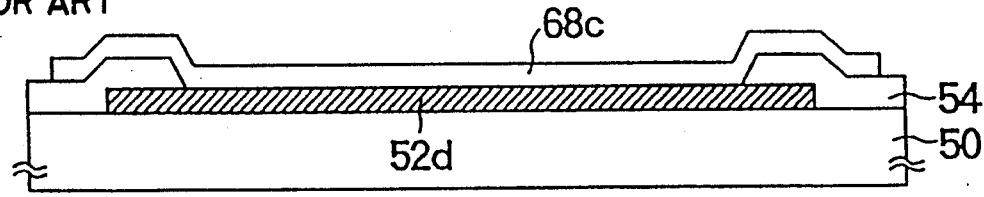
FIG. 26D is a sectional view (Part 8) of the inverse staggered TFT matrix device of FIGS. 17 and 18D in steps of the method for fabricating the same.
Figure 27A:
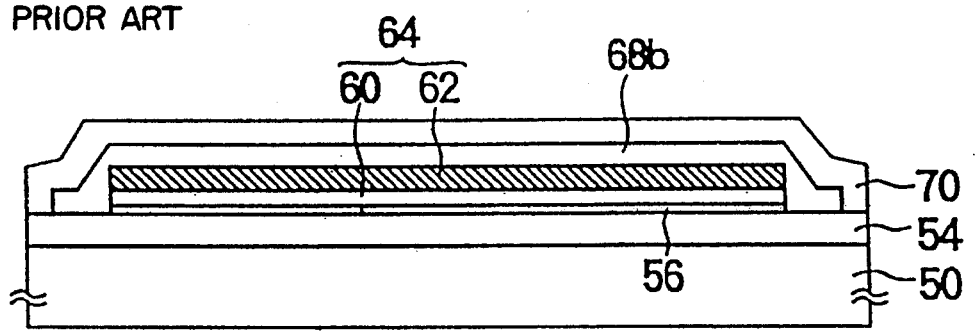
FIG. 27A is a sectional view (Part 9) of the inverse staggered TFT matrix device of FIGS. 17 and 18A in steps of the method for fabricating the same.
Figure 27B:
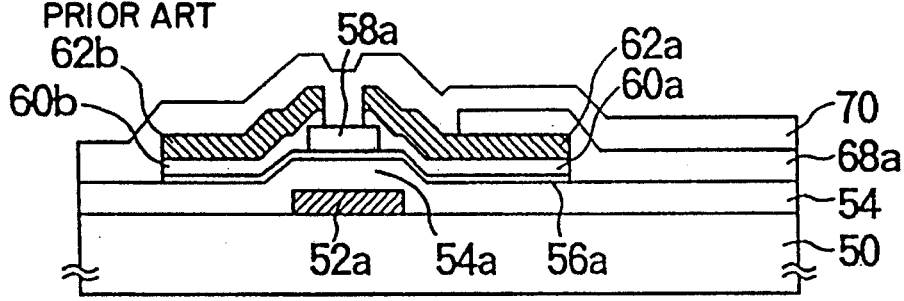
FIG. 27B is a sectional view (Part 9) of the inverse staggered TFT matrix device of FIGS. 17 and 18B in steps of the method for fabricating the same.
Figure 27C:
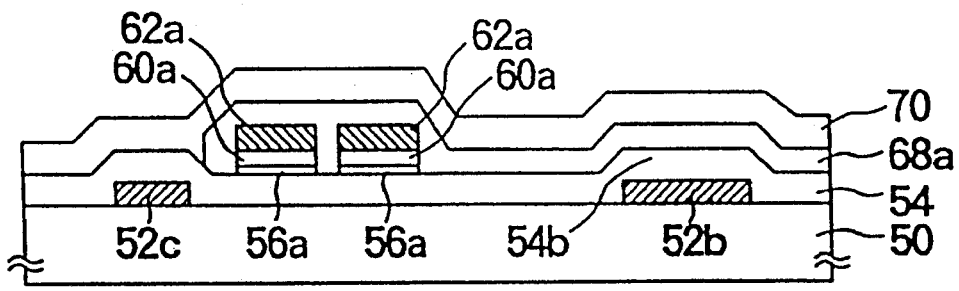
FIG. 27C is a sectional view (Part 9) of the inverse staggered TFT matrix device of FIGS. 17 and 18C in steps of the method for fabricating the same.
Figure 27D:
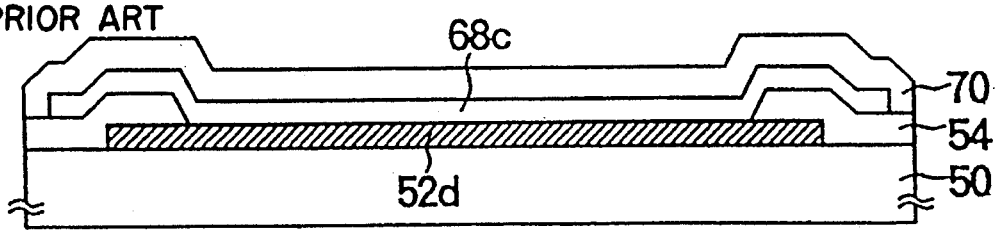
FIG. 27D is a sectional view (Part 9) of the inverse staggered TFT matrix device of FIGS. 17 and 18D in steps of the method for fabricating the same.
Figure 28A:
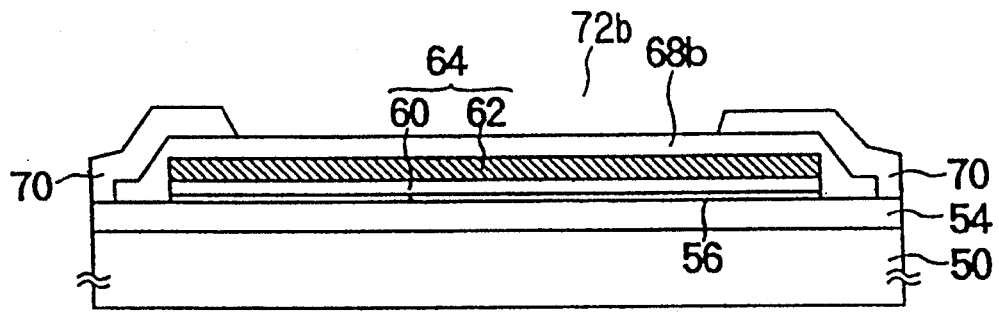
FIG. 28A is sectional view (Part 10) of the inverse staggered TFT matrix device of FIGS. 17 and 18A in steps of the method for fabricating the same.
Figure 28B:
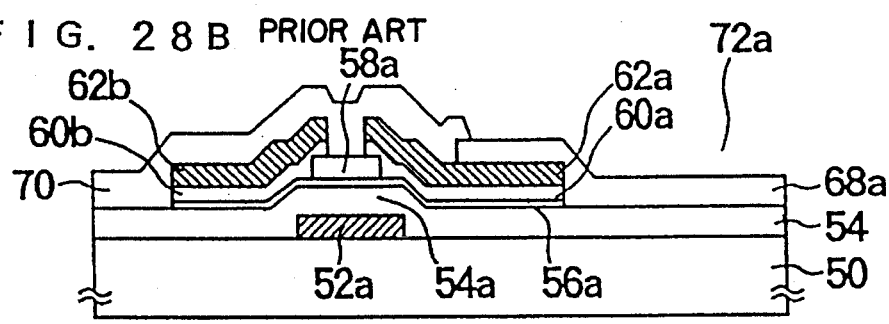
FIG. 28B is a sectional view (Part 10) of the inverse staggered TFT matrix device of FIGS. 17 and 18B in steps of the method for fabricating the same.
Figure 28C:
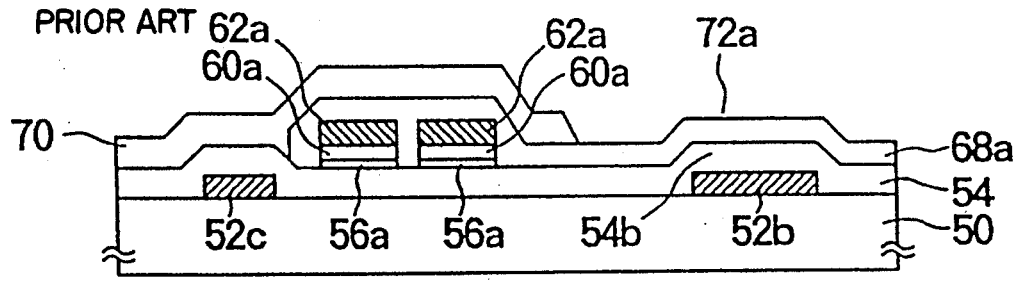
FIG. 28C is a sectional view (Part 10) of the inverse staggered TFT matrix device of FIGS. 17 and 18C in steps of the method for fabricating the same.
Figure 28D:
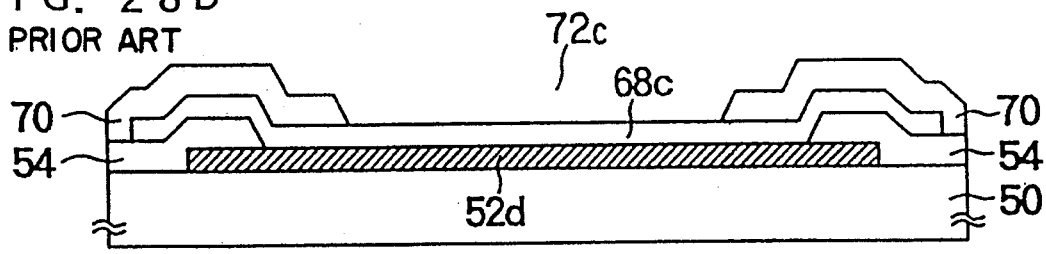
FIG. 28D is a sectional view (Part 10) of the inverse staggered TFT matrix device of FIGS. 17 and 18D in steps of the method for fabricating the same.

Next, the method for fabricating the TFT matrix device of FIGS. 12, 13A, 13B, 13C, and 13D will be explained with reference to FIGS. 14A to 16D which are sectional views of the TFT matrix device in the respective steps of the fabrication method. FIGS. 14A, 15A, 16A represent the drain terminal unit, FIGS. 14B, 15B, 16B represent the TFT unit, FIGS. 14C, 15C, 16C represent the picture element unit and the storage capacitance unit, and FIGS. 14D, 15D, 16D represent the gate terminal unit respectively along the line A—A' section, the B—B' section, C—C' section and the D—D' section in FIG. 12. The common parts with the TFT matrix device of FIGS. 3A to 11D are represented by common reference numerals not to repeat their explanation.

Following the steps shown in FIGS. 3A to 6D, a gate electrode 12a, a Cs electrode 12b, a gate bus line 12c connected to the gate electrode 12a, and a gate terminal lower electrode 12d connected to the gate bus line 12c are formed on a transparent insulating substrate 10, and then an insulating film 14 and a non-doped i-type a-Si layer 16 are formed on the entire surface in the stated order. Further, a channel protecting film 18a is formed on the gate insulating film 14a above the gate electrode 12a. Subsequently, an $n^+$a-si layer 20 and a metal film 22 are formed on the entire surface in the stated order(FIGS. 14A to 14D).

Then, the metal film 22, the $n^+$-type a-Si layer 20 and the i-type a-Si 16 are selectively etched to form an a-Si active layer 16a on the gate insulating film 14a, while a source electrode 22a and a drain electrode 22b connected to the a-Si active layer 16a respectively through an $n^+$-type a-Si contact layers 20a, 20b on both sides of the channel protecting film 18a, and the TFT is completed.

At the same time, in the drain terminal unit, a drain terminal lower electrode 28 comprising an $n^+$-type a-Si layer 20 and the metal film 22 connected to the drain electrode 22b through a drain bus line is formed.

Different from the first embodiment, the i-type a-Si layer 16, the $n^+$-type a-Si layer 20 and the metal layer 22 are not left on the Cs electrode 12b of the storage capacitance unit. Accordingly, it is necessary neither to form a dielectric film comprising the insulating film 14 and the i-type a-Si layer 16, nor to form a counter electrode comprising the $n^+$-type a-Si layer 20 and the metal layer 22 (FIGS. 15A to 15D).

Then, following the steps shown in FIGS. 8A to 11D, the passivation film 30 is formed on the entire surface to cover the completed TFT, and then the passivation film 30, or the passivation film 30 and the insulating film 14 are selectively etched to form contact holes on the source electrode 22a, the drain terminal lower electrode 18 and the gate terminal lower electrode 12d. No contact hole is opened on the counter electrode because different form the first embodiment, no counter electrode is formed.

Subsequently, a transparent conducting film 34 is formed, and then the transparent conducting film 34 is patterned as required to form the picture element electrode 34a connected to the source electrode 22a, the drain terminal upper electrode 34b connected to the drain terminal lower electrode 28, the gate terminal upper electrode 34c connected to the gate terminal lower electrode 12d.

Thus, completed the picture element unit comprising the picture element electrode 34a connected to the source electrode 22a of the TFT unit, the drain terminal unit comprising the drain terminal upper electrode 34b and the drain terminal lower electrode 28 connected to the drain electrode 22b of the TFT unit through the drain bus line, and the gate terminal unit comprising the gate terminal upper electrode 34d and the gate terminal lower electrode 12d connected to the gate electrode 12a of the TFT unit through the gate bus line 12c.

At this time, the picture element electrode 34a is formed on a dielectric film 38 comprising the insulating film 14 and the passivation film 30 above the Cs electrode 12b, and accordingly the storage capacitance unit comprising the picture element electrode 34a functioning as the counter electrode, the Cs electrode 12b, and the dielectric film 38 held between both electrodes is completed (FIGS. 16A to 16D).

In the second embodiment as well, the step of forming the passivation film 30 is followed by the step of forming the transparent conducting film 34 to form the gate terminal upper electrode 34c, and the insulating film 14 and the passivation film 30 on the gate terminal lower electrode 12d are opened in a single window opening step. As in the first embodiment, the fabrication process of the TFT matrix device can be simplified, and lower cost can be realized.

But, in the second embodiment, the storage capacitance unit comprises the Cs electrode 12b formed on the transparent insulating substrate 10, the dielectric film 38 comprising the insulating film 14 and the passivation film 30 formed on the Cs electrode 12b, and the picture element electrode 34a formed on the dielectric film 38, which functions as the counter electrode. That is, the dielectric film 38 in the second embodiment is considerably thicker than that in the first embodiment. The second embodiment is suitable for a case in which a capacity of the storage capacitance unit may be relatively small.

What is claimed is:

1. A thin film transistor matrix device comprising:

a transparent insulating substrate;

a thin film transistor unit including a gate electrode formed on the transparent insulating substrate; a semiconductor active layer formed on the gate electrode through a gate insulating film; a source electrode and a drain electrode formed opposed to each other on the semiconductor active layer respectively through a semiconductor contact layer; and a passivation film covering the source electrode and the drain electrode;

a picture element unit including a picture element electrode formed in connection with the source electrode of the thin film transistor unit; and a storage capacitance unit connected to the picture element electrode of the picture element unit, the storage capacitance unit including a storage capacitance electrode formed on the transparent insulating substrate and formed of a metal layer of the same material as the gate electrode; a dielectric film formed on the storage capacitance electrode and formed of an insulating film common with the gate insulating film and a non-doped semiconductor layer of the same material as the semiconductor active layer; and a counter electrode formed on the dielectric film and formed of a doped semiconductor layer of the same material as the semiconductor contact layer and a metal layer of the same material as the source electrode and the drain electrode, the counter electrode being connected to the picture element electrode.

2. A thin film transistor matrix device according to claim 1, wherein the counter electrode is connected to the picture element electrode through a contact hole opened in a protecting film common with the passivation film.

3. A thin film transistor matrix device according to claim 1, wherein the semiconductor active layer is an amorphous silicon active layer.

4. A thin film transistor matrix device comprising:

a transparent insulating substrate;

a thin film transistor unit including a gate electrode formed on the transparent insulating substrate; a semiconductor active layer formed on the gate electrode through a gate insulating film; a source electrode and a drain electrode formed opposed to each other on the semiconductor active layer through a semiconductor contact layer; and a protecting film covering the source electrode and the drain electrode;

a picture element unit including a picture element electrode formed in connection with the source electrode of the thin film transistor unit;

a storage capacitance, unit connected to the picture dement electrode of the picture element unit;

a gate terminal unit connected to the gate electrode of the thin film transistor unit through a gate bus line; and a drain terminal unit connected to the drain electrode of the thin film transistor unit through a drain bus line, the gate terminal unit including a gate terminal lower electrode formed on the transparent insulating substrate and formed of a metal layer common with the gate electrode;

and a gate terminal upper electrode formed on the gate terminal lower electrode through a contact hole in an insulating film common with the gate insulating film and a contact hole in the protecting film the gate terminal upper electrode being formed of a transparent conducting film of the same material as the picture element electrode, the contact hole in the insulating film and the contact hole in the protecting film being substantially aligned.

5. A thin film transistor matrix device according to claim 4, wherein the semiconductor active layer is an amorphous silicon active layer.

6. A thin film transistor matrix device comprising:

a transparent insulating substrate;

a thin film transistor unit including a gate electrode formed on the transparent insulating substrate; a semiconductor active layer formed on the gate electrode through a gate insulating film; a source electrode and a drain electrode formed opposed to each other on the semiconductor active layer through a semiconductor contact layer; and a protecting film covering the source electrode and the drain electrode;

a picture element unit including a picture element electrode formed in connection with the source electrode of the thin film transistor unit;

a storage capacitance unit connected to the picture element electrode of the picture element unit;

a gate terminal unit connected to the gate electrode of the thin film transistor unit through a gate bus line; and a drain terminal unit connected to the drain electrode of the thin film transistor unit through a drain bus line, the gate terminal unit including a gate terminal lower electrode formed on the transparent insulating substrate arid formed of a metal layer common with the gate electrode; and a gate terminal upper electrode formed on the gate terminal lower electrode through a contact hole in an insulating film common with the gate insulating film and a contact hole in the protecting film, the gate terminal upper electrode being formed of a transparent conducting film of the same material as the picture element electrode, the protecting film and the insulating film being in contact in the vicinity of the contact hole in the insulating film and in the vicinity of the contact hole in the protecting film.

* * * * *

UNITED STATES PATENT AND TRADEMARK OFFICE
CERTIFICATE OF CORRECTION

PATENT NO. : 5,483,082
DATED : January 9, 1996
INVENTOR(S) : Hideaki TAKIZAWA et al.

It is certified that error appears in the above-indentified patent and that said Letters Patent is hereby corrected as shown below:

Column 9, line 52, change "stag" to --staggered--.

Column 20, line 17, delete ",";

line 18, change "dement" to --element--;

line 30, delete ","; and line 63, delete "arid" and insert --and-- therein.

Signed and Sealed this

Thirtieth Day of April, 1996

*Attest:*

BRUCE LEHMAN

*Attesting Officer*    *Commissioner of Patents and Trademarks*